(12) United States Patent
Tran et al.

(10) Patent No.: US 10,477,626 B2
(45) Date of Patent: Nov. 12, 2019

(54) HARD SWITCHING DISABLE FOR SWITCHING POWER DEVICE

(71) Applicant: Alpha and Omega Semiconductor (Cayman) Ltd., Grand Cayman (KY)

(72) Inventors: Son Tran, San Jose, CA (US); Bum-Seok Suh, Gyeonggi-Do (KR); Wonjin Cho, Gyeonggi-Do (KR)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 240 days.

(21) Appl. No.: 15/464,130

(22) Filed: Mar. 20, 2017

(65) Prior Publication Data

US 2018/0145676 A1 May 24, 2018

Related U.S. Application Data

(63) Continuation-in-part of application No. 15/360,590, filed on Nov. 23, 2016, now Pat. No. 10,411,692.

(51) Int. Cl.
*H03K 17/081* (2006.01)
*H03K 5/19* (2006.01)
(Continued)

(52) U.S. Cl.
CPC .............. *H05B 6/062* (2013.01); *H03K 5/19* (2013.01); *H03K 17/0828* (2013.01);
(Continued)

(58) Field of Classification Search
CPC ................... H03K 5/19; H03K 17/168; H03K 19/017509; H03K 17/162; H05B 6/062
(Continued)

(56) References Cited

U.S. PATENT DOCUMENTS 4,890,185 A    12/1989   Karl et al.
5,500,616 A     3/1996   Ochi
(Continued)

FOREIGN PATENT DOCUMENTS

CN    103794585 A    5/2014
CN    204906177 U   12/2015
(Continued)

OTHER PUBLICATIONS

A. Jain, R. Mallik, G. Catalisano and L. Abbatelli, "IGBT over voltage protection scheme in quasi resonant induction heating applications," 2015 Annual IEEE India Conference (INDICON), New Delhi, 2015, pp. 1-5.
(Continued)

*Primary Examiner* — Zeev V Kitov
(74) *Attorney, Agent, or Firm* — Patent Law Works LLP

(57) ABSTRACT

A controller for driving a power switch incorporates a hard turn-on disable circuit to prevent the power switch from turning on when the power switch is sustaining a high voltage value. The hard turn-on disable circuit includes a hard turn-on detection circuit and a protection logic circuit. The hard turn-on disable circuit is configured to block or to pass the system input signal to the normal gate drive circuit of the power switch depending on the detection indicator signal. In particular, the protection logic circuit blocks the system input signal $V_{IN}$ in response to a high voltage detection so that the power switch ignores the system input signal $V_{IN}$, which may be erroneous, and the power switch is prevented from undesirable hard switching.

15 Claims, 12 Drawing Sheets

(51) Int. Cl.
  H03K 19/0175 (2006.01)
  H05B 6/06 (2006.01)
  H03K 17/082 (2006.01)
  H03K 17/16 (2006.01)
(52) U.S. Cl.
  CPC ... *H03K 17/168* (2013.01); *H03K 19/017509* (2013.01); *H03K 17/162* (2013.01)
(58) Field of Classification Search
  USPC ......................................................... 361/91.1
  See application file for complete search history.

(56) References Cited

U.S. PATENT DOCUMENTS

| | | | |
|---|---|---|---|
| 5,608,595 A | 3/1997 | Gourab et al. | |
| 6,097,582 A * | 8/2000 | John | H03K 17/165 361/79 |
| 6,194,885 B1 * | 2/2001 | Oshima | H02M 1/4225 323/285 |
| 6,414,533 B1 | 7/2002 | Graves | |
| 7,902,604 B2 | 3/2011 | Su | |
| 9,013,848 B2 | 4/2015 | Lui | |
| 2013/0127429 A1 | 5/2013 | Li | |
| 2014/0346522 A1 | 11/2014 | Disney et al. | |
| 2015/0346750 A1 * | 12/2015 | Bhattad | G05F 1/575 323/280 |
| 2016/0099189 A1 | 4/2016 | Khai Yen et al. | |
| 2016/0105017 A1 | 4/2016 | Mallik et al. | |
| 2017/0122996 A1 | 5/2017 | Sullivan | |
| 2017/0302151 A1 | 10/2017 | Snook et al. | |
| 2018/0020507 A1 | 1/2018 | Liu et al. | |
| 2018/0270913 A1 | 9/2018 | Bredemeier et al. | |

FOREIGN PATENT DOCUMENTS

| | | |
|---|---|---|
| CN | 205004739 U | 1/2016 |
| CN | 105489561 A | 4/2016 |
| CN | 105991005 A | 10/2016 |
| TW | 494628 B | 7/2002 |
| TW | 201334423 A | 8/2013 |
| TW | I426596 B | 2/2014 |
| TW | 201440399 A | 10/2014 |
| TW | 201534028 A | 9/2015 |
| TW | I519068 B | 1/2016 |
| TW | 201624901 A | 7/2016 |
| TW | 201717354 A | 5/2017 |

OTHER PUBLICATIONS

B. Rubino, C. Parisi and S. Buonomo, "Potential of new SLLIMM™—nano Intelligent Molded Module for low power home appliance motor drives," Power Electronics and Motion Control Conference (EPE/PEMC), 2012 15th International, Novi Sad, 2012, pp. LS6d.1-1-LS6d.1-7.

G. Majumdar, K. H. Hussein, M. Iwasaki, H. Kawafuji, T. Iwagami and H. Yoshida, "Novel intelligent power modules for low-power inverters," Power Electronics Specialists Conference, 1998. PESC 98 Record. 29th Annual IEEE, Fukuoka, 1998, pp. 1173-1179 vol. 2.

G. Majumdar, T. Hiramoto, T. Shirasawa, T. Tanaka and K. Mochizuki, "Active surge voltage clamped 600 A IPM for high power application," Power Semiconductor Devices and ICs, 1995. ISPSD '95., Proceedings of the 7th International Symposium on, Yokohama, 1995, pp. 75-79.

J. Song J. Lee, D. Chung, B. Suh and F. Wolfgang, "A new intelligent power module with Reverse conducting IGBTs for up to 2.5kW motor drives," Power Electronics Conference (IPEC), 2010 International, Sapporo, 2010, pp. 156-158.

J. Song, J. Lee, D. Chung and F. Wolfgang, "The new intelligent power modules with Reverse conducting IGBTs and SOI driver for low power motor drives," Electrical Machines and Systems (ICEMS), 2010 International Conference on, Incheon, 2010, pp. 384-386.

K. Yoshida, M. Kudoh, S. Takeuchi, S. Furuhata and T. Fujihira, "A self-isolated intelligent IGBT for driving ignition coils," Power Semiconductor Devices and ICs, 1998. ISPSD 98. Proceedings of the 10th International Symposium on, Kyoto, 1998, pp. 105-108.

L. Dulau, S. Pontarollo, A. Boimond, J. F. Garnier, N. Giraudo and O. Terrasse, "A new gate driver integrated circuit for IGBT devices with advanced protections," in IEEE Transactions on Power Electronics, vol. 21, No. 1, pp. 38-44, Jan. 2006.

M. E. Tulu and D. Yildirim, "Induction cooker design with quasi resonant topology using jitter drive method," Environment and Electrical Engineering (EEEIC), 2013 12th International Conference on, Wroclaw, 2013, pp. 1-6.

M. F. Alkayal and J. C. Crebier, "Integrated monolithic over-voltage protection circuit with adjustable threshold voltage," Industry Applications Conference, 2004. 39th IAS Annual Meeting. Conference Record of the 2004 IEEE, 2004, pp. 1903-1909 vol. 3.

M. Honsberg, E. Thal, E. Stumpf and E. Wiesner, "A novel ultra compact surface mountable 1A/500V rated Intelligent Power Module (IPM) utilizing Silicon on Insulator (SOI) technology," 2007 International Aegean Conference on Electrical Machines and Power Electronics, Bodrum, 2007, pp. 47-51.

N. Clark, E. Motto and S. Shibata, "New Slim Package Intelligent Power Modules (SLIMDIP) with thin RC-IGBT for consumer goods applications," 2015 IEEE Energy Conversion Congress and Exposition (ECCE), Montreal, QC, 2015, pp. 4510-4512.

O. Lucia, P. Maussion, E. J. Dede and J. M. Burdío, "Induction Heating Technology and Its Applications: Past Developments, Current Technology, and Future Challenges," in IEEE Transactions on Industrial Electronics, vol. 61, No. 5, pp. 2509-2520, May 2014.

S. Shim, B. Choo, J. Lee and D. Chung, "A new high efficient 2-phase and 3-phase interleaved Power Factor Correction boost converter typed Intelligent Power Module with high switching capability for low power home appliances," 2015 9th International Conference on Power Electronics and ECCE Asia (ICPE-ECCE Asia), Seoul, 2015, pp. 2324-2327.

T. Laska et al., "Short circuit properties of Trench-/Field-Stop-IGBTs-design aspects for a superior robustness," Power Semiconductor Devices and ICs, 2003. Proceedings. ISPSD '03.2003 IEEE 15th International Symposium on, 2003, pp. 152-155.

V. Crisafulli and C. V. Pastore, "New control method to increase power regulation in a AC/AC quasi resonant converter for high efficiency induction cooker," 2012 3rd IEEE International Symposium on Power Electronics for Distributed Generation Systems (PEDG), Aalborg, 2012, pp. 628-635.

V. John, Bum-Seok Suh and T. A. Lipo, "High-performance active gate drive for high-power IGBT's," in IEEE Transactions on Industry Applications, vol. 35, No. 5, pp. 1108-1117, Sep./Oct. 1999.

V. John, Bum-Seok Suh and T. A. Lipo, "Fast-clamped short-circuit protection of IGBT's," in IEEE Transactions on Industry Applications, vol. 35, No. 2, pp. 477-486, Mar./Apr. 1999.

Z. Wang, X. Shi, L. M. Tolbert, F. Wang and B. J. Blalock, "A di/dt Feedback-Based Active Gate Driver for Smart Switching and Fast Overcurrent Protection of IGBT Modules," in IEEE Transactions on Power Electronics, vol. 29, No. 7, pp. 3720-3732, Jul. 2014.

* cited by examiner

HARD SWITCHING DISABLE FOR SWITCHING POWER DEVICE

CROSS REFERENCE TO OTHER APPLICATIONS

This application is a continuation-in-part of U.S. patent application Ser. No. 15/360,590, entitled ACTIVE CLAMP OVERVOLTAGE PROTECTION FOR SWITCHING POWER DEVICE, filed Nov. 23, 2016, now U.S. Pat. No. 10,411,692, issued Sep. 10, 2019, which is incorporated herein by reference for all purposes.

BACKGROUND OF THE INVENTION

Induction heating has been widely adopted in domestic, industrial and medical applications. Induction heating refers to the technique of heating an electrically conducting object (such as a metal) by electromagnetic induction whereby electric current is generated in a closed circuit (the object) by the fluctuation of current in another circuit placed physically close to the object. For example, an induction cooker includes a resonant tank driven by an alternating current to induce an alternating magnetic field at an induction coil. The alternating magnetic field at the induction coil induces current in a metal cooking pot placed physically near the induction coil. The current induced in the resistive metal cooking pot generates heat which in turn heats the food in the cooking pot.

A commonly used topology for induction heating applications is the single switch quasi-resonant inverter topology including a single power switch and a single resonant capacitor to supply variable resonant current to the induction coil. The single switch quasi-resonant inverter is often implemented using an insulated gate bipolar transistor (IGBT) as the power switching device due to the high power capability and high switching frequency operation of IGBTs.

Overvoltage conditions, such as a power surge, can be a serious problem for the single switch quasi-resonant inverter circuit. In particular, the power switching device in the quasi-resonant inverter circuit may fail or become permanently damaged when a voltage exceeding the voltage rating of the power switching device is applied. For example, an abnormally high surge voltage may be applied to the AC input line during a lightning event. In the event that the surge voltage exceeds the breakdown voltage of the power switching device, the power switching device may become irreversibly damaged if remedial action is not taken within a very short time from the power surge event, on the order of a few microseconds.

Furthermore, during the normal operation of the single switch quasi-resonant inverter, the power switch is turned on and off at a given switching frequency, for example, 30 kHz. During the time the power switch is turned off, the voltage across the power switch can reach a high peak voltage, such as 1 kV. If the power switch is unexpectedly turned on again when the voltage across the switching device is still at a high voltage value, the power switch experiences hard switching which can negatively impact the efficiency and reliability of the power switch.

BRIEF DESCRIPTION OF THE DRAWINGS

Various embodiments of the invention are disclosed in the following detailed description and the accompanying drawings.

DETAILED DESCRIPTION

Figure 1:
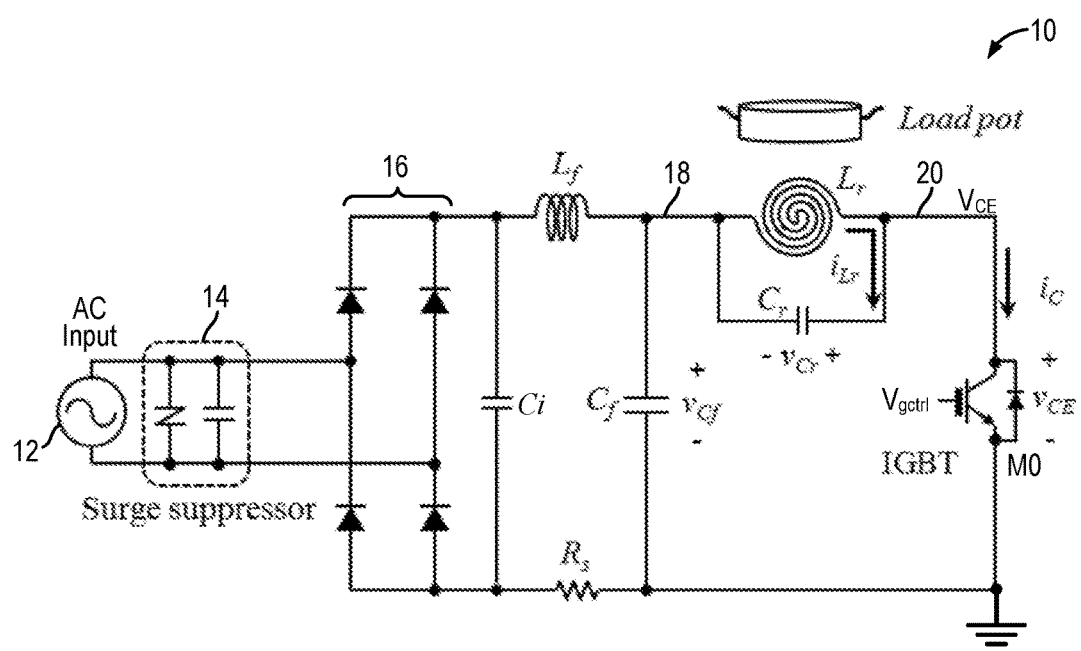
FIG. 1 is a circuit diagram of a single switch quasi-resonant inverter applied in an induction heating application in some examples.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a controller for driving a power switch incorporates a protection circuit to protect the power switch from fault conditions, such as over-voltage conditions or power surge events. The protection circuit includes a fault detection circuit and a protection gate drive circuit. The fault detection circuit is configured to monitor the voltage across the power switch and to generate a fault detection indicator signal and the protection gate drive circuit is configured to generate a gate drive signal to turn on the power switch in response to a detected fault condition. In particular, the protection gate drive circuit generates a gate drive signal that has a slow assertion transition and is clamped at a given gate voltage value. In this manner, the protection circuit implements active clamping of the gate terminal of the power switch and safe handling of the power switch during over-voltage events.

In some embodiments, the protection gate drive circuit drives the power switch to turn on for predetermined time duration to dissipate the energy from a fault over-voltage event across the power switch. In other embodiments, the fault detection circuit includes a hysteresis over-voltage detection circuit using a set voltage level and a reset voltage level for fault condition detection, the set voltage level being higher than the reset voltage level. The fault detection indicator signal is asserted when the voltage across the power switch exceeds the set voltage level and the fault detection indicator signal is deasserted when the voltage across the power switch drops below the reset voltage level. In some embodiments, the protection gate drive circuit asserts the gate drive signal to turn on the power switch at the clamped gate voltage in response to the fault detection indicator signal being asserted. The protection gate drive circuit applies the clamped gate drive signal until the fault detection indicator signal is deasserted or for a predetermined fixed time duration, whichever is shorter.

In embodiments of the present invention, the controller is applied to drive a power switch incorporated in a single switch quasi-resonant inverter for induction heating applications. The single switch quasi-resonant inverter is often implemented using an insulated gate bipolar transistor (IGBT) as the power switching device due to the high power capability and high switching frequency operation of the IGBTs. The protection circuit of the present invention implements an active gate drive protection scheme to protect a power switch and can be advantageously applied to protect the IGBT in a quasi-resonant inverter circuit used in induction heating applications.

The protection circuit of the present invention realizes advantages over conventional protection schemes for power switching devices or IGBTs. In particular, the protection circuit of the present invention implements active clamping with soft gate drive control to protect the power switching device during an over-voltage event. During an over-voltage event, the power switching device is turned on with the gate voltage clamped to protect the gate terminal of the power switching device from excessive voltages. Meanwhile, the power switching device is turned on one or more times successively to dissipate the excessive voltage and current. The soft gate drive control, including soft turn-on and soft-turn-off, dampens the oscillations that may be generated from the voltage transients across the power switching device during the on and off switching. The protection circuit of the present invention realizes effective over-voltage protection of power switching devices or IGBTs.

Furthermore, in embodiments of the present invention, a controller for driving a power switch incorporates a hard turn-on disable circuit to prevent the power switch from turning on when the power switch is sustaining a high voltage value. The hard turn-on disable circuit includes a hard turn-on detection circuit and a protection logic circuit. The hard turn-on detection circuit is configured to monitor the voltage across the power switch and to generate a detection indicator signal indicative of a high voltage across the power switch and based on the state of the detection indicator signal, the protection logic circuit is configured to block or to pass the system input signal to the normal gate drive circuit of the power switch. In particular, the protection logic circuit blocks the system input signal $V_{IN}$ in response to a high voltage detection so that the power switch ignores the system input signal $V_{IN}$, which may be erroneous, and the power switch is prevented from being turned on while the power switch is driven to a high voltage level. In this manner, the hard turn-on disable circuit is operative to prevent excessively hard turn-on switching of the power switch which can occur during abnormal system conditions, such as AC supply swell and malfunctioning control signals. In embodiments of the present invention, the controller is applied to drive a power switch incorporated in a single switch quasi-resonant inverter for induction heating applications.

Additionally, in embodiments of the present invention, a controller for driving a power switch incorporates a two-level protection circuit implementing a two protection schemes for the power switch. In some embodiments, the protection circuit implements a first level protection to prevent the power switch from hard switching or hard turn on due to system input signal mistriggering. The protection circuit further implements a second level protection to protect the power switch from over-voltage conditions or power surge events, such as lightning events. In particular, the second level protection implements soft turn-on and active clamping of the gate voltage of the power switch to prevent the power switch from going beyond its dynamic breakdown voltage and to keep the power switch in the safe operating area. As thus configured, the protection circuit improves the noise immunity, efficiency, and reliability of the power switch in operation. In embodiments of the present invention, the controller is applied to drive a power switch incorporated in a single switch quasi-resonant inverter for induction heating applications.

FIG. 1 is a circuit diagram of a single switch quasi-resonant inverter applied in an induction heating application in some examples. Referring to FIG. 1, a single switch quasi-resonant inverter 10 includes a surge suppressor 14, a bridge rectifier 16, a filter circuit, a resonant tank and a power switching device M0, also referred to as a power switch. The quasi-resonant inverter 10 receives an AC input voltage 12 which is coupled to the surge suppressor 14. The bridge rectifier 16, also referred to as a diode bridge, converts the AC input voltage 12 to a DC voltage which is then filtered by the filter circuit including an input capacitor $C_i$, a filter inductor $L_f$, a filter capacitor $C_f$ and a resistor $R_S$. The filtered DC voltage $V_{Cf}$ (node 18) is applied to the resonant tank formed by an induction coil Lr and a resonant capacitor Cr. The induction coil Lr is connected to the power switch M0 which is switched on and off in response to a gate drive signal $V_{gctrl}$. When the power switch M0 is turned on, a current $i_C$ flow from the induction coil Lr through the power switch M0 to ground. When the power switch M0 is turned off, no current flow through the power switch M0. Instead, a current $i_{Lr}$ circulates between the induction coil Lr and the resonant capacitor Cr. In the present embodiment, the power switch M0 is an insulated gate bipolar transistor (IGBT). The collector terminal of the IGBT is connected to the induction coil Lr (node 20) and the emitter terminal of the IGBT is connected to ground. The gate terminal of the IGBT is driven by the gate drive signal $V_{gctrl}$.

In operation, when the power switch M0 (IGBT) is turned on, an alternating electric current flows through the induction coil Lr, which produces an oscillating magnetic field. The oscillating magnetic field induces an electric current into a metal cooking pot placed physically near the induction coil. The current flows in the resistive metal pot will generate heat, thereby heating the food in the cooking pot. When the power switch M0 is turned off, the current $i_{Lr}$ circulates around the induction coil Lr and the capacitor Cr. The power switch M0 is turned on and off in response to the gate drive signal $V_{gctrl}$ to control the amount of electric current induced in the cooking pot, there by controlling the amount of heat generated.

The power switch M0 (IGBT) is turned on and off during the operation of the single switch quasi-resonant inverter. The power switch M0 can experience high voltage transients at the power terminal (node 20) when the power switch is being turned off. For example, when the IGBT is switched off, the collector voltage $V_{CE}$ (node 20) can increase very fast, such as up to 800-1000V for an AC input voltage of 220V. In this case, an IGBT with a typical voltage rating of 1.7 kV for collector-emitter voltage can handle the normal voltage transients during on-off switching operation. However, the IGBT may be exposed to fault over-voltage conditions, such as a power surge event, where a voltage surge induces a voltage at the induction coil Lr that exceeds the voltage rating of the IGBT. For instance, during a lightning event, an abnormally large power surge may be introduced to the AC power line. A power surge event caused by lightning can drive the collector voltage of the IGBT to above 2 kV, beyond the voltage rating of the IGBT, resulting in damage to the IGBT. Therefore, the power switch or IGBT in the single switch quasi-resonant inverter needs to be protected from over-voltage events, such as an excessive power surge event.

Furthermore, the power switch needs to be protected from power surge events especially when the power surge event occurs when the power switch is turned off. When the power switch is turned on, the power switch can dissipate the surge voltage to ground by conduction through its power terminals. For example, when the IGBT is turned on, the IGBT can conduct the voltage surge from the collector to the emitter which is connected to ground to dissipate the voltage surge. However, if the IGBT is turned off, the transistor does not dissipate the surge voltage and the collector terminal may experience excessive surge voltage exceeding the voltage rating of the device, causing permanent damage to the transistor.

Figure 2:
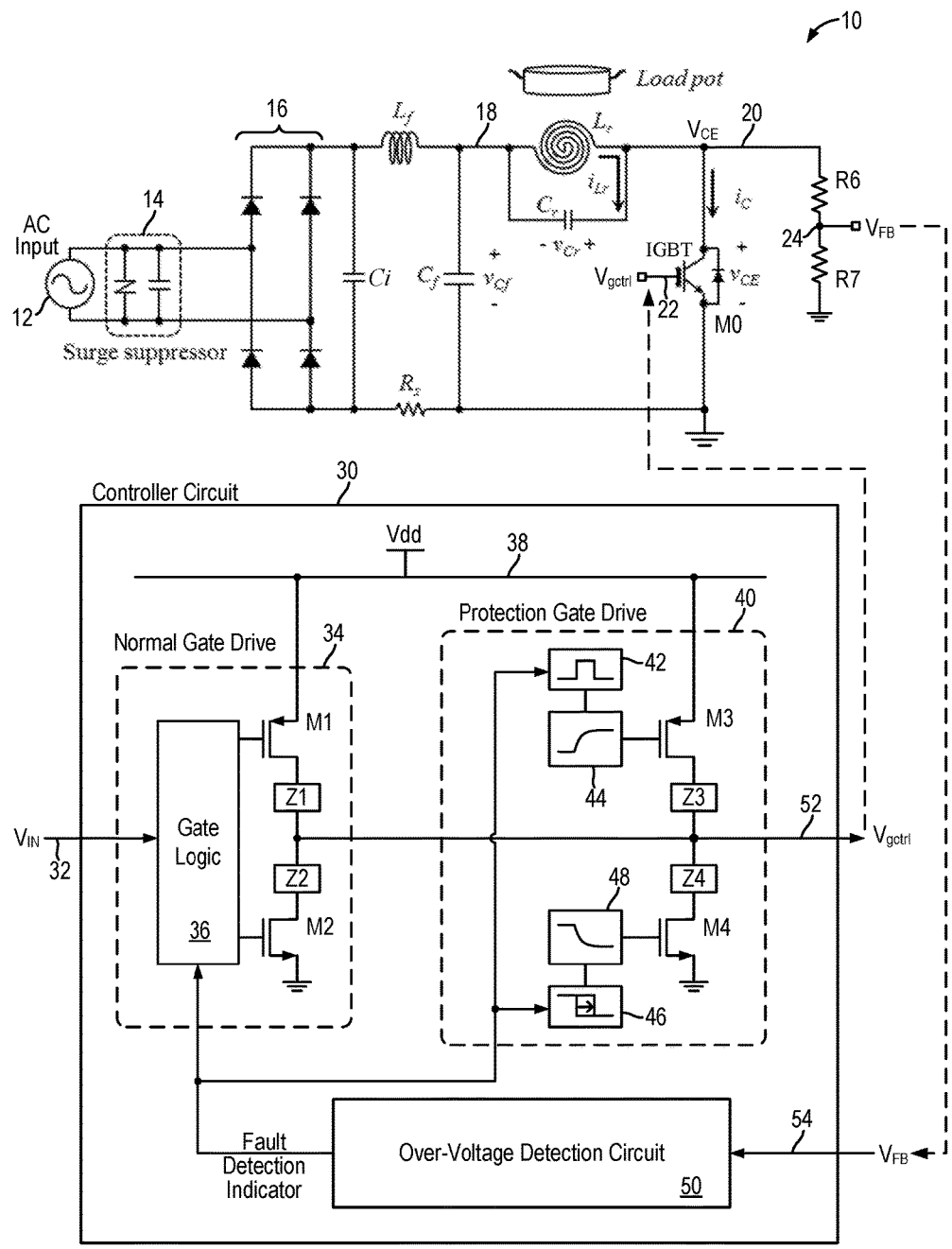
FIG. 2 is a block diagram of a controller circuit including a protection circuit coupled to drive the power switch in a single switch quasi-resonant inverter for induction heating application in embodiments of the present invention.

FIG. 2 is a block diagram of a controller circuit including a protection circuit coupled to drive the power switch in a single switch quasi-resonant inverter for induction heating application in embodiments of the present invention. Referring to FIG. 2, the single switch quasi-resonant inverter 10 of FIG. 1 is driven by a controller circuit 30 to switch the power switch M0 on and off to conduct current alternately through the induction coil Lr. In the present embodiment, the power switch M0 is an IGBT having a gate as the control terminal and collector and emitter terminals as the power terminals. In the following description, the controller circuit will be described as driving the IGBT as the power switch M0. The present description is illustrative only and not intended to be limiting. It is understood that the power switch M0 can be implemented using other power switching devices other than an IGBT. A power switch or a power switching device includes a control terminal or a gate terminal receiving a control signal or a gate drive signal and a pair of power terminals conducting currents.

In embodiments of the present invention, the controller circuit 30 includes a normal gate drive circuit 34 and a protection circuit formed by a protection gate drive circuit 40 and a fault detection circuit 50. In the present embodiment, the fault detection circuit 50 is constructed as an over-voltage detection circuit configured to detect an over-voltage condition or excessive voltage event at the collector terminal (node 20) of the IGBT or an excessive collector-to-emitter voltage $V_{CE}$ at the IGBT.

In controller circuit 30, the normal gate drive circuit 34 receives an input signal $V_{IN}$ (node 32) for controlling the on and off switch cycle of the power switch M0 or the IGBT to obtain the desired power output at the quasi-resonant inverter. The input signal $V_{IN}$ can be a PWM signal, or a clock signal switching between on period and off period. The normal gate drive circuit 34 generates an output signal on node 52 as the gate drive signal $V_{gctrl}$ coupled to the gate terminal (node 22) of the IGBT. In the present embodiment, the normal gate drive circuit is constructed as a CMOS inverter and includes a PMOS transistor M1 connected in series with an NMOS transistor M2 between the positive power supply Vdd (node 38) and ground. An impedance Z1 is coupled to the drain terminal (node 52) of the PMOS transistor M1 and an impedance Z2 is coupled to the drain terminal (node 52) of the NMOS transistor M2. The common node 52 between the PMOS transistor M1 and the NMOS transistor M2 is the output signal of the normal gate drive circuit 34.

A gate logic circuit 36 receives the input signal $V_{IN}$ and generates gate control signals for the PMOS transistor M1 and the NMOS transistor M2. The gate logic circuit 36 generates gate control signals for the PMOS transistor M1 and the NMOS transistor M2 so that the PMOS transistor M1 and the NMOS transistor M2 are turned on and off alternately in response to the input signal $V_{IN}$. That is, the PMOS transistor M1 and the NMOS transistor M2 are not turned on at the same time. Accordingly, as the input signal $V_{IN}$ switches between a logical high level and a logical low level, the normal gate drive circuit 34 generates the gate drive signal $V_{gctrl}$ to cause the IGBT to switch on and off in normal operation. More specifically, the NMOS transistor M2 is turned on to drive the gate terminal of the IGBT to ground to turn off the IGBT in normal operation. Alternately, the PMOS transistor M1 is turned on to drive the gate terminal of the IGBT to power supply voltage Vdd to turn on the IGBT in normal operation.

The controller circuit 30 includes a protection circuit providing over-voltage protection for the power switch M0 or IGBT at the gate drive level. The protection circuit implements active gate clamping and safe handling of over-voltage events at the power switch of the quasi-resonant inverter. The protection circuit includes the over-voltage detection circuit 50 and the protection gate drive circuit 40. The over-voltage detection circuit 50 detects for over-voltage fault conditions during the normal operation of the power switch and activates remedial actions to protect the power switch from damage. The protection gate drive circuit 40 is activated in response to the detection of a fault condition to generate a clamped gate voltage as the gate drive signal to bias the power switch so as to dissipate the voltage surge before any damage is done to the power switch.

The over-voltage detection circuit 50 receives a feedback voltage $V_{FB}$ on an input node 54 indicative of the collectorto-emitter voltage $V_{CE}$ of the IGBT, or the voltage across the power terminals of the power switch M0. In the present embodiment, a voltage divider formed by resistors R6 and R7 is coupled to the collector terminal (node 20) of the IGBT to divide down the collector-to-emitter voltage as the feedback voltage $V_{FB}$. The feedback voltage $V_{FB}$ (node 24) is coupled to the over-voltage detection circuit 50 to detect for an over-voltage condition. In embodiments of the present invention, the over-voltage detection circuit 50 is operative only during the off-period of the IGBT. That is, the over-voltage detection circuit 50 is activated to monitor the collector-to-emitter voltage only during the time period when the IGBT is driven by the gate drive signal $V_{gctrl}$ to be fully turned off.

When the IGBT is fully turned on, the IGBT conducts current from the collector to the emitter and the collector voltage (node 20) is held at the saturation voltage $V_{CE-SAT}$ voltage. So even if there is a power surge, the collector voltage at the IGBT is low and the IGBT is protected from damage. However, during the period when the IGBT is fully turned off, a power surge at the collector terminal of the IGBT may result in a collector voltage that is too high and damage the IGBT.

During the off-period of the IGBT, the over-voltage detection circuit 50 compares the feedback voltage $V_{FB}$ (node 24) to an over-voltage threshold voltage value to determine if an over-voltage condition has occurred at the collector terminal of the IGBT. The over-voltage detection circuit 50 generates a fault detection indicator signal in the event that the feedback voltage $V_{FB}$ exceeds the over-voltage threshold voltage value. More specifically, the over-voltage detection circuit 50 asserts the fault detection indicator signal in response to the feedback voltage $V_{FB}$ exceeding the over-voltage threshold voltage value and deasserts the fault detection indicator signal in response to the feedback voltage $V_{FB}$ being below the over-voltage threshold voltage value. In some embodiments, the over-voltage detection circuit is constructed as a hysteresis over-voltage detection circuit including a set voltage level and a reset voltage level for fault over-voltage condition detection, the set voltage level being higher than the reset voltage level. The fault detection indicator signal is asserted when the feedback voltage exceeds the set voltage level and the fault detection indicator signal is deasserted when the feedback voltage drops below the reset voltage level.

The fault detection indicator signal, or a signal indicative thereof, is provided to the normal gate drive circuit 34 and to the protection gate drive circuit 40. At the normal gate drive circuit 34, the fault detection indicator signal, or its equivalent, is coupled to the gate logic circuit 36 and is operative to disable or turn off the NMOS transistor M2 when a fault over-voltage condition is detected. During the time period when the over-voltage detection circuit 50 is active, the IGBT is turned off, meaning that the NMOS transistor M2 in the normal gate drive circuit 34 is activated or turned on to drive the gate drive signal to ground, thereby turning off the IGBT. In order to initiates remedial measures in response to the detection of a fault over-voltage condition, the NMOS transistor M2 should be turned off or disabled so that the protection gate drive circuit 40 can be activated to drive the gate of the IGBT. In this manner, the protection gate drive circuit 40 does not have to over-drive the NMOS transistor M2. In other words, in normal operation, transistors M1 and M2 are alternately turned on and off to drive the gate of the IGBT. However, when an over-voltage condition is detected, both transistors M1 and M2 are turned off prior to or at the same time as remediation measures are being initiated at the protection gate drive circuit 40.

The fault detection indicator signal, or a signal indicative thereof, is also provided to protection gate drive circuit 40 to initiate remedial measures to protect the IGBT. In the present embodiment, the protection gate drive circuit 40 includes a PMOS transistor M3 connected in series with an NMOS transistor M4 between the positive power supply Vdd (node 38) and ground. An impedance Z3 is provided at the drain terminal (node 52) of the PMOS transistor M3 and an impedance Z4 is provided at the drain terminal (node 52) of the NMOS transistor M4. The common node 52 between the PMOS transistor M3 and the NMOS transistor M4 is the output signal of the protection gate drive circuit. The protection gate drive circuit 40 generates an output signal on node 52 as the gate drive signal $V_{gctrl}$ coupled to the gate terminal (node 22) of the IGBT.

The fault detection indicator signal, or a signal indicative thereof, generated by the over-voltage detection circuit 50 is coupled to control the PMOS transistor M3 and the NMOS transistor M4 through respective time controllers and gate voltage clamping circuits. At PMOS transistor M3, the fault detection indicator signal, or a signal indicative thereof, is coupled to a time controller 42 and a gate control circuit 44. The time controller 42 controls the on-duration of PMOS transistor M3 in response to the fault detection indicator signal. In particular, the time controller 42 causes the PMOS transistor M3 to be turned on until the fault detection indicator signal is deasserted or for a predetermined fixed time duration (also called "one shot duration"), whichever is shorter. At NMOS transistor M4, the fault detection indicator signal is coupled to a time controller 46 and a gate control circuit 48. The time controller 46 controls the on-duration of NMOS transistor M4 in response to the fault detection indicator signal. In particular, the time controller 46 delays the off assertion time of the NMOS transistor M4 to provide a soft turn-off of the IGBT, as will be explained in more detail below.

In operation, responsive to the fault detection indicator signal being asserted, the NMOS transistor M2 in the normal gate drive circuit 34 is turned off. Meanwhile, the protection gate drive circuit 40 turns on both the PMOS transistor M3 and the NMOS transistor M4. With both PMOS transistor M3 and the NMOS transistor M4 being turned on, the impedance Z3 and impedance Z4 form a voltage divider between the positive power supply voltage and ground. The voltage divider of Z3 and Z4 generates an output signal as the gate drive signal on output node 52 being a divided down voltage of the positive power supply voltage Vdd. In particular, the gate drive signal is clamped at a voltage value being a function of the impedances Z3 and Z4 and given as:

$$\text{Clamped Voltage} = \frac{Z4 + M4(rdson)}{(Z4 + M4(rdson)) + (Z3 + M3(rdson))} \times Vdd. \quad \text{Eq. (1)}$$

Accordingly, the protection gate drive circuit 40 generates an output signal at a clamped gate voltage value as the gate drive signal $V_{gctrl}$ to drive the gate terminal of the IGBT. The IGBT is therefore turned on during an over-voltage event to dissipate the excessive charge at the collector terminal (node 20). By driving the gate of the IGBT through a voltage divider of Z3 and Z4, the gate of the IGBT is turned on gradually, achieving soft turn-on for the clamped gate voltage. In this manner, the protection gate drive circuit 40 turns on the IGBT in a protection mode to discharge the voltage surge.

The over-voltage detection circuit 50 continues to monitor the feedback voltage $V_{FB}$. When the collector-to-emitter voltage $V_{CE}$ (node 20) drops below the over-voltage threshold voltage value, or the reset voltage level in a hysteresis detection circuit, the over-voltage detection circuit 50 deasserts the fault detection indicator signal. The protection gate drive circuit 40 can then be deactivated to turn off the IGBT in the protection mode. In operation, the time controller 42 will deassert the gate control signal to PMOS transistor M3 first to release the clamped gate voltage at the output node 52. In embodiments of the present invention, the protection circuit applies the clamped gate drive signal to turn the IGBT on during an over-voltage event but the on-duration of the IGBT is limited to a maximum duration determined by a fixed time duration. In cases where the voltage surge does not get dissipated with the IGBT being turned on at the clamped gate voltage, the fault detection indicator signal may remain asserted for an extended duration which is undesirable. It is not desirable to keep the IGBT turned on for too long as it may impact the reliability of the IGBT. Accordingly, the time controller 42 in the protection gate drive circuit 40 applies a maximum one-shot duration to the on-time of PMOS transistor M3. The time controller 42 deasserts the gate control signal to PMOS transistor M3 when the fault detection indicator signal being deasserted or when the fixed time duration has expired, whichever is sooner.

With the PMOS transistor M3 being disabled, the output signal of the protection gate drive circuit 40 is no longer driven to the clamped gate voltage. However, the gate terminal (node 22) of the IGBT needs to be discharged to ground in order to turn off the IGBT. Accordingly, when the fault detection indicator signal is deasserted, time controller 46 delays the deassertion of the gate drive signal to NMOS transistor M4. Therefore, when the over-voltage protection event has passed and the PMOS transistor M3 has been turned off, the NMOS transistor M4 remains turned on for a given delay time to discharge the gate terminal (node 22) of the IGBT, thereby achieving soft turn-off of the clamped gate voltage. After the delay duration, the NMOS transistor M4 is turned off and the NMOS transistor M2 in the normal gate drive circuit 34 is turned back on to hold the gate terminal of the IGBT to ground before the IGBT returns to normal operation.

As thus configured, the protection circuit implemented in the controller circuit 30 realizes gate drive level over-protection for the IGBT in the quasi-resonant inverter 10. In particular, by using the voltage divider of Z3 and Z4, the gate voltage of the IGBT is precisely controlled between the threshold $V_{GE\_th}$ and the Miller plateau level. Thus, the IGBT is turned on to enable the induction coil current $i_{Lr}$ to flow through the IGBT and the resonant capacitor voltage $V_{Cr}$ to be clamped at the desired level when the fault overvoltage condition occurs. In this manner, the protection circuit uses active gate drive to safely protect the IGBT or the power switch in the quasi-resonant inverter from voltage surge or other over-voltage events. The protection circuit implements soft turn on and turn-off operations to switch the IGBT without large transients. In some embodiments, the protection gate drive circuit is constructed using impedances Z3 and Z4 that ensures the clamped gate voltage to be independent of temperature variation.

Figure 3:
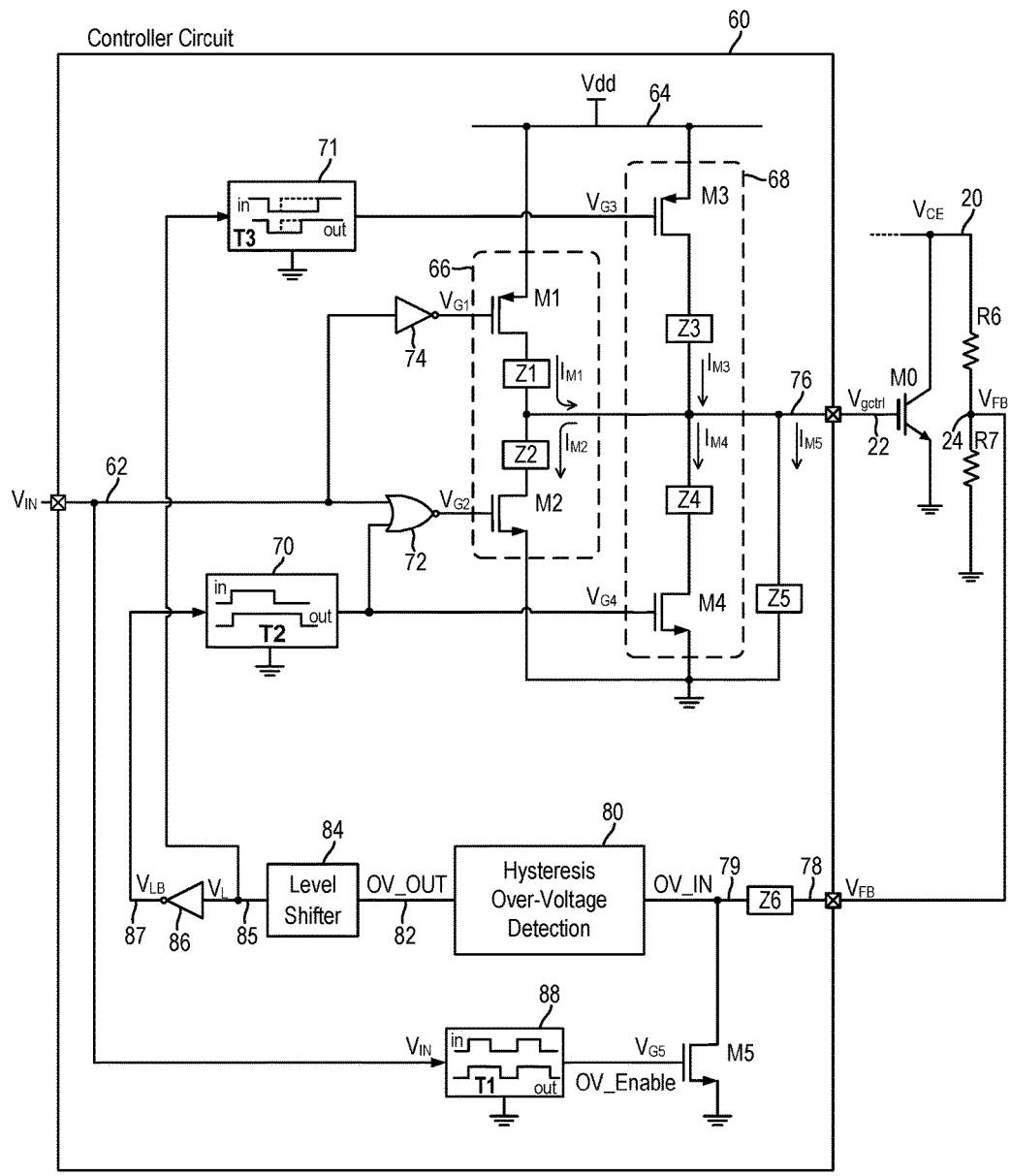
FIG. 3 is a circuit diagram illustrating the construction of the controller circuit of FIG. 2 in embodiments of the present invention.

FIG. 3 is a circuit diagram illustrating the construction of the controller circuit of FIG. 2 in embodiments of the present invention. Referring to FIG. 3, a controller circuit 60 for driving the gate terminal (node 22) of an IGBT includes a normal gate drive circuit 66 and a protection gate drive circuit 68. The controller circuit 60 also includes a hysteresis over-voltage detection circuit 80 configured to detect an over-voltage condition or excessive voltage event at the collector terminal (node 20) of the IGBT or an excessive collector-to-emitter voltage $V_{CE}$ at the IGBT.

In controller circuit 60, the normal gate drive circuit 66 receives an input signal $V_{IN}$ (node 62) for controlling the on and off switch cycle of the IGBT to obtain the desired power output at the quasi-resonant inverter. The normal gate drive circuit is constructed as a CMOS inverter and includes a PMOS transistor M1 connected in series with an NMOS transistor M2 between the positive power supply Vdd (node 64) and ground. An impedance Z1 is coupled to the drain terminal (node 76) of the PMOS transistor M1 and an impedance Z2 is coupled to the drain terminal (node 76) of the NMOS transistor M2. The common node 76 between the PMOS transistor M1 and the NMOS transistor M2 is the output signal of the normal gate drive circuit 34. The input signal $V_{IN}$ can be a PWM signal, or a clock signal switching between on period and off period. The normal gate drive circuit 66 generates an output signal on node 76 as the gate drive signal $V_{gctrl}$ coupled to the gate terminal (node 22) of the IGBT. In some embodiments, an impedance Z5 may be coupled to the output node 76 to keep the gate of the IGBT grounded should the gate is not driven by any other circuitry. The impedance Z5 is optional and may be omitted in other embodiments.

The input voltage $V_{IN}$ is coupled to an NOR gate 72 generating a gate control signal $V_{G2}$ for controlling the NMOS transistor M2. The input voltage $V_{IN}$ is further coupled to an inverter 74 generating a gate control signal $V_{G1}$ for controlling the PMOS transistor M1. The PMOS transistor M1 and the NMOS transistor M2 essentially function as a CMOS inverter for inverting the logical states of the input voltage $V_{IN}$ to drive the gate terminals of transistors M1 and M2. Thus, when the input voltage $V_{IN}$ is at a logical high, the PMOS transistor M1 is turned on and the NMOS transistor M2 is turned off. Meanwhile, when the input voltage $V_{IN}$ is at a logical low, the PMOS transistor M1 is turned off and the NMOS transistor M2 is turned on. NMOS transistor M2 is further controlled by a gate control signal $V_{G4}$ generated by a time controller 70. The input voltage $V_{IN}$ and the gate control signal $V_{G4}$ are coupled to the NOR gate 72. Therefore, the gate control signal $V_{G2}$ will assert (logical high) only when both the input voltage $V_{IN}$ and the gate control signal $V_{G4}$ are at a logical low. Otherwise, the gate control signal $V_{G2}$ is deasserted (logical low). The gate control signal $V_{G4}$ is generated from the fault detection indicator signal, as will be described in more details below.

The hysteresis over-voltage detection circuit 80 receives a feedback voltage $V_{FB}$ on an input node 78 indicative of the collector-to-emitter voltage $V_{CE}$ of the IGBT. In the present embodiment, a voltage divider formed by resistors R6 and R7 is coupled to the collector terminal (node 20) of the IGBT to divide down the collector-to-emitter voltage as the feedback voltage $V_{FB}$. The feedback voltage $V_{FB}$ (node 24) is coupled to the hysteresis over-voltage detection circuit 80 through an input impedance Z6 as the over-voltage monitor signal OV_IN to detect for an over-voltage condition. The input impedance Z6 functions as an analog filter for the feedback voltage and also provides the ESD protection for the NMOS transistor M5. In embodiments of the present invention, the hysteresis over-voltage detection circuit 80 is operative only during the off-period of the IGBT. Accordingly, the NMOS transistor M5 is coupled to the input node 79 to enable or disable the over-voltage monitor signal OV_IN in response to the input voltage $V_{IN}$. More specifically, the input voltage $V_{IN}$ is coupled to a timer controller 88. The timer controller 88 receives the input voltage signal $V_{IN}$ and generates an output signal OV_Enable being the input voltage with an extended on-period T1. The OV_Enable signal is the gate control signal $V_{G5}$ coupled to drive the gate terminal of NMOS transistor M5. NMOS transistor M5 is therefore turned on when the input voltage is asserted to turn on the IGBT. With NMOS transistor M5 turned on, the input node 79 is shorted to ground and therefore the over-voltage monitor signal OV_IN is disabled. The time controller 88 extends the on-time of the input voltage signal so as to mask the high-to-low transition of the input voltage $V_{IN}$ from the detection operation. That is, the NMOS transistor M5 remains turned on for a short duration after the falling edge of the input voltage VIN. In other words, the over-voltage monitor signal OV_IN is enabled a short duration after the input voltage $V_{IN}$ is deasserted, therefore masking the transition time from the detection operation. In this manner, the hysteresis over-voltage detection circuit 80 is activated to monitor the collector-to-emitter voltage $V_{CE}$ of the IGBT only during the time period when the IGBT is driven by the gate drive signal $V_{gctrl}$ to be fully turned off.

In some embodiments, the hysteresis over-voltage detection circuit 80 is constructed using a hysteresis band fast response and high gain comparator using a bandgap reference voltage. The hysteresis over-voltage detection circuit 80 is able to provide precise detection of over-voltage conditions by monitoring of the feedback voltage.

At the hysteresis over-voltage detection circuit 80, the over-voltage monitor signal OV_IN is compared to over-voltage threshold voltage values to determine if an over-voltage condition has occurred at the collector terminal of the IGBT. In particular, the hysteresis over-voltage detection circuit including a set voltage level and a reset voltage level for fault over-voltage condition detection, the set voltage level being higher than the reset voltage level. The over-voltage monitor signal OV_IN is compared to the set voltage level and the reset voltage level as the threshold voltage values. The hysteresis over-voltage detection circuit 80 generates a fault detection indicator signal OV_OUT (node 82). The fault detection indicator signal OV_OUT is asserted when the over-voltage monitor signal OV_IN exceeds the set voltage level and the fault detection indicator signal is deasserted when the over-voltage monitor signal OV_IN drops below the reset voltage level.

The fault detection indicator signal OV_OUT (node 82) is coupled to a level shifter 84 to adjust the voltage level of the indicator signal. The level-adjusted fault detection indicator signal $V_L$ (node 85) is coupled to an inverter 86 to generate an inverted indicator signal $V_{LB}$ (node 87). The level-adjusted fault detection indicator signal $V_L$ and inverted indicator signal $V_{LB}$ are coupled to drive the normal gate drive circuit 66 and the protection gate drive circuit 68. In the present embodiment, the fault detection indicator signal OV_OUT is an active low signal. That is, the fault detection indicator signal OV_OUT is normally at a logical high level (deasserted) and when a fault over-voltage condition is detected, the fault detection indicator signal OV_OUT transitions to a logical low level (asserted).

The protection gate drive circuit 68 includes a PMOS transistor M3 connected in series with an NMOS transistor M4 between the positive power supply Vdd (node 64) and ground. An impedance Z3 is provided at the drain terminal (node 76) of the PMOS transistor M3 and an impedance Z4 is provided at the drain terminal (node 76) of the NMOS transistor M4. The common node 76 between the PMOS transistor M3 and the NMOS transistor M4 is the output signal of the protection gate drive circuit. The protection gate drive circuit 68 generates an output signal on node 76 as the gate drive signal $V_{gctrl}$ coupled to the gate terminal (node 22) of the IGBT.

The fault detection indicator signal, or a signal indicative thereof, generated by the hysteresis over-voltage detection circuit 80 is coupled to the normal gate drive circuit 66 and to the protection gate drive circuit 68 to initiate remediation measures in response to detection of an over-voltage event. First, the inverted fault detection indicator signal $V_{LB}$ is coupled to the time controller 70. The inverted fault detection indicator signal $V_{LB}$ is at a logical low level when deasserted and at a logical high level when asserted. The time controller 70 passes the inverted fault detection indicator signal $V_{LB}$ to the output but with extended on duration T2. That is, the time controller 70 asserts the gate control signal $V_{G4}$ in response to the inverted fault detection indicator signal $V_{LB}$ being asserted and the time controller 70 deasserts the gate control signal $V_{G4}$ a given delay time after the inverted fault detection indicator signal $V_{LB}$ is deasserted. The gate control signal $V_{G4}$ is coupled to the NOR gate 72 whose output drives the NMOS transistor M2 in the normal gate drive circuit 66 and is also coupled to drive the NMOS transistor M4 in the protection gate drive circuit 68.

As described above, the hysteresis over-voltage detection circuit 80 is operative only during the off-period of the IGBT. In that case, the input voltage $V_{IN}$ is deasserted (logical low) and the gate control signal $V_{G2}$ is at a logical high level to drive the NMOS transistor M2 to a fully on-state. With NMOS transistor M2 fully turned on and the PMOS transistor M1 fully turned off, the gate terminal (node 22) of the IGBT is discharged to ground and is held at ground during the off-period. In response to the detection of an over-voltage event, the inverted fault detection indicator signal $V_{LB}$ is asserted (logical high) and the gate control signal $V_{G4}$ is asserted (logical high) as well. Therefore, the gate control signal $V_{G2}$ coupled to drive the NMOS transistor M2 transitions to a logical low level and the NMOS transistor M2 is disabled or turned off. Thus, the normal gate drive circuit 66 is disabled and is no longer driving the IGBT. Meanwhile, the gate control signal $V_{G4}$, being asserted, is also coupled to the gate terminal of the NMOS transistor M4 to turn the NMOS transistor M4 on.

Second, the fault detection indicator signal $V_L$ is coupled to the time controller 71. The fault detection indicator signal $V_L$ is at a logical high level when deasserted and at a logical low level when asserted. The time controller 71 passes the fault detection indicator signal $V_L$ to the output with an one-shot duration control. That is, the time controller 71 asserts (logical low) the gate control signal $V_{G3}$ in response to the fault detection indicator signal $V_L$ being asserted and the time controller 71 deasserts the gate control signal $V_{G3}$ in response to the fault detection indicator signal $V_L$ being deasserted or the expiration of a fixed time duration T3, whichever occurs first. Therefore, the maximum time duration the gate control signal $V_{G3}$ will be asserted is the fixed time duration, also referred to as the one-shot duration. The gate control signal $V_{G3}$ will be asserted for the one-shot duration or shorter. The gate control signal $V_{G3}$ is coupled to drive the gate terminal of the PMOS transistor M3 in the protection gate drive circuit 68.

In response to the detection of an over-voltage event, the fault detection indicator signal $V_L$ is asserted (logical low)

and the gate control signal $V_{G3}$ is asserted (logical low) as well. The gate control signal $V_{G3}$ is coupled to the gate terminal of the PMOS transistor M3 to turn the PMOS transistor M3 on in response to the detection of the over-voltage event. The PMOS transistor M3 is turned on until the fault detection indicator signal $V_L$ is deasserted or the one-shot duration T3 has expired.

In operation, responsive to the fault detection indicator signal OV_OUT being asserted, the NMOS transistor M2 in the normal gate drive circuit 66 is turned off. Meanwhile, the protection gate drive circuit 68 turns on both the PMOS transistor M3 and the NMOS transistor M4. With both PMOS transistor M3 and the NMOS transistor M4 being turned on, the impedance Z3 and impedance Z4 form a voltage divider between the positive power supply voltage and ground. The voltage divider of Z3 and Z4 generates an output signal as the gate drive signal on output node 76 being a divided down voltage of the positive power supply voltage Vdd. In particular, the gate drive signal is clamped at a voltage value being a function of the impedances Z3 and Z4 and given as (Z4/(Z3+Z4))*Vdd. Accordingly, the protection gate drive circuit 68 generates an output signal at a clamped gate voltage value as the gate drive signal $V_{gctrl}$ to drive the gate terminal of the IGBT. The IGBT is therefore turned on during an over-voltage event to dissipate the excessive charge at the collector terminal (node 20). It is imperative to note that by driving the gate of the IGBT through a voltage divider of Z3 and Z4, the gate of the IGBT is turned on gradually, achieving soft turn-on control. In this manner, the protection gate drive circuit 68 turns on the IGBT in a protection mode to discharge the voltage surge.

In some embodiments, the ratio of the impedances Z3 and Z4 is 0.55. The clamped gate voltage applied to the IGBT is therefore about half of the power supply voltage Vdd. Furthermore, the protection circuit is capable of activating the protection gate drive circuit 68 very quickly to clamp the gate voltage of the IGBT. In one example, the peak of a power surge at the AC input may take about 15 μs to arrive at the collector terminal of the IGBT in the quasi-resonant inverter circuit. However, the protection circuit of the present invention is able to clamp the gate voltage of the IGBT at around 500 ns—long before the peak of the power surge arrives at the collector terminal. In this manner, the IGBT is turned on when the peak surge voltage reaches the collector terminal and the IGBT is able to dissipate the power surge safely, without damaging the IGBT.

The hysteresis over-voltage detection circuit 80 continues to monitor the feedback voltage $V_{FB}$. When the collector-to-emitter voltage $V_{CE}$ (node 20) drops below the reset voltage level, the over-voltage detection circuit 80 deasserts the fault detection indicator signal OV_OUT. The protection gate drive circuit 68 can then be deactivated to turn off the IGBT in the protection mode. In operation, the time controller 71 deasserts the gate control signal $V_{G3}$ to PMOS transistor M3 when the fault detection indicator signal $V_L$ is deasserted (logical high), or when the fixed time duration has expired, whichever is sooner. The clamped gate voltage at the output node 76 is therefore released. Meanwhile, the time controller 70 deasserts the gate control signal $V_{G4}$ a delayed time duration T2 after the inverted fault detection indicator signal $V_{LB}$ is deasserted (logical low). The NMOS transistor M4 is kept on after the PMOS transistor M3 is turned off in order to discharge the gate terminal (node 22) of the IGBT to turn off the IGBT. After the delay duration T2, the NMOS transistor M4 is turned off and the NMOS transistor M2 in the normal gate drive circuit 34 is turned back on to hold the gate terminal of the IGBT to ground before the IGBT returns to normal operation.

In embodiments of the present invention, the protection circuit of the present invention generates the clamped gate voltage for the gate drive signal (node 22) that is precisely controlled and without the voltage overshoot issues typically associated with conventional Zener-diode clamping method. Furthermore, the clamped gate voltage can be precisely controlled over temperature and fabrication process variations. In some embodiments, the impedances Z3 and Z4 are implemented using polysilicon resistors.

Figure 4:
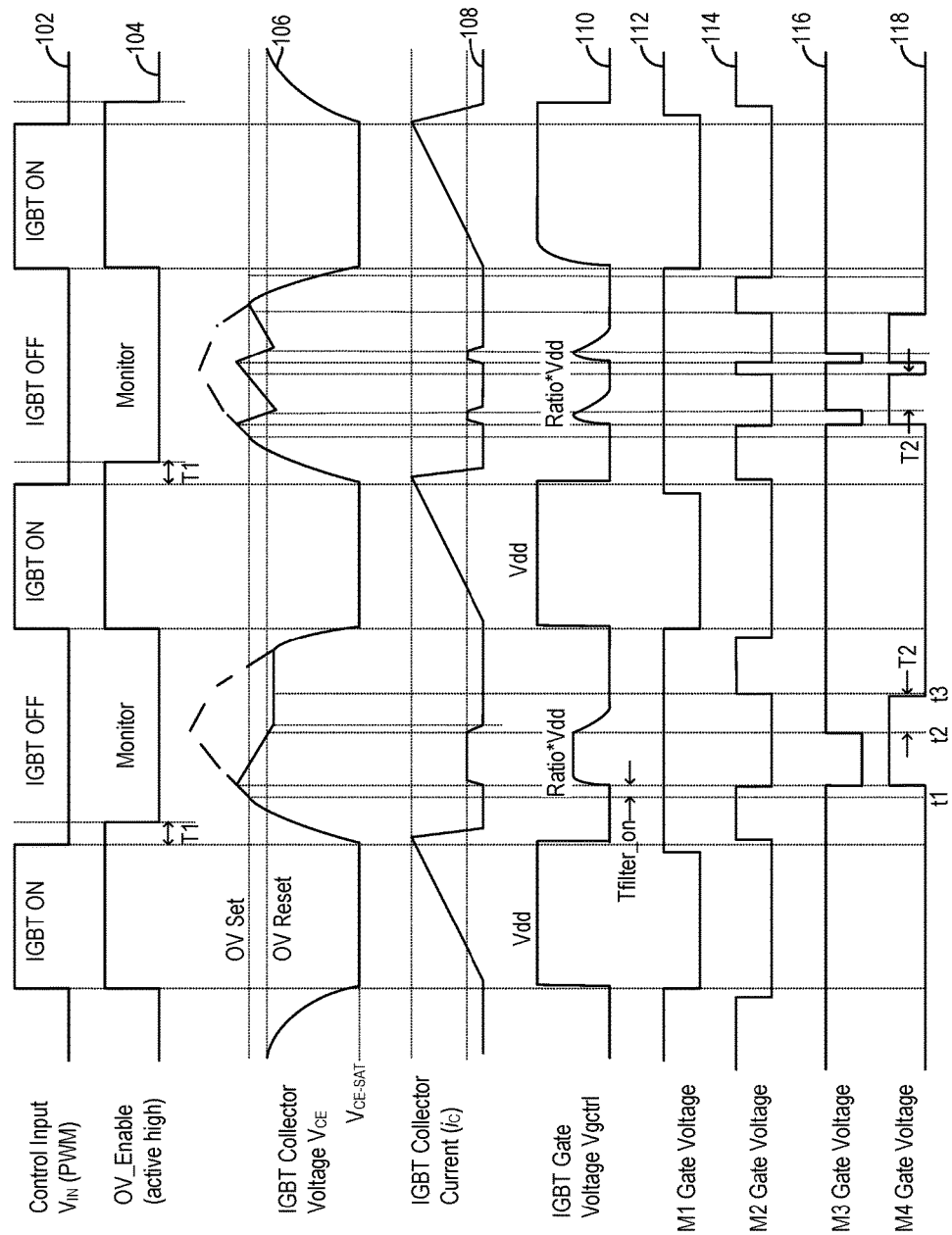
FIG. 4 is a timing diagram illustrating the operation of the controller circuit of FIG. 3 in some examples.

FIG. 4 is a timing diagram illustrating the operation of the controller circuit of FIG. 3 in some examples. Referring to FIG. 4, the input signal $V_{IN}$ (curve 102) is a PWM signal to turn the IGBT on and off to conduct current alternately through the induction coil. The time controller 88 generates the gate control signal OV_Enable (104) to drive the NMOS transistor M5 to enable or disable the over-voltage monitoring. In particular, the OV_Enable signal is extended by a duration T1 beyond the deassertion of the input signal $V_{IN}$ to mask the high-to-low transition of the input signal from the over-voltage monitoring. In normal operation, the gate voltage $V_{gctrl}$ of the IGBT (curve 110) switches between ground and the power supply voltage Vdd to turn the IGBT on and off. Meanwhile, the collector current $i_C$ (curve 108) increases linearly during the on-period of the IGBT and then decreases to zero during the off-period of the IGBT. In normal operation, the gate control signals for transistors M1 and M2 (curves 112 and 114) have a logical low levels during the on-period and have a logical high levels during the off-period of the IGBT. In normal operation, the gate control signal for transistor M3 (curve 116) is at a logical high level while the gate control signal for the transistor M4 (curve 118) is at a logical low level to disable the protection gate drive circuit.

During the on-period of the IGBT, the collector-to-emitter voltage $V_{CE}$ (curve 106) is driven to the collector-emitter saturation voltage $V_{CE-SAT}$. However, when the IGBT is turned off, the collector voltage can increase to a large voltage value, such as 600V. The IGBT typically has a voltage rating of 1.7 kV and can withstand the normal collector voltage excursion during the normal operation of the IGBT.

The hysteresis over-voltage detection circuit monitors the collector voltage $V_{CE}$ of the IGBT during the off period of the IGBT and after the delay period T1 which masks the on-to-off transition of the input voltage $V_{IN}$. At time t1, certain power surge event causes the collector voltage $V_{CE}$ to exceed the set voltage level of the hysteresis over-voltage detection circuit. In one example, the set voltage level corresponds to about 1.4 kV of collector voltage. The hysteresis over-voltage detection circuit asserts the fault detection indicator signal. Within a very short time, such as by time t1, remediation measure is initiated. The gate control signal for transistor M2 is disabled (logical low) to turn off transistor M2. The gate control signal for transistor M3 is enabled (logical low) to turn on transistor M3 while the gate control signal for transistor M4 is enabled (logical high) to turn on transistor M4. As a result of transistors M3 and M4 being turned on, the gate voltage of the IGBT rises to the clamped gate voltage value defined by the Z3/Z4 voltage divider. The IGBT is turned on by the clamped gate voltage to conduct collector current $i_C$ to dissipate the power surge. As a result, the collector voltage $V_{CE}$ decrease.

At time t2, the collector voltage $V_{CE}$ decreases below the reset voltage level of the hysteresis over-voltage detection circuit. In one example, the reset voltage level corresponds to about 1.2 kV of collector voltage. The hysteresis over-voltage detection circuit deasserts the fault detection indicator signal and transistor M3 is deasserted (logical high). Transistor M4 is kept on for the extended duration of T2 to discharge the gate voltage of the IGBT. At time t3, at the expiration of the duration T2, transistor M4 is turned off and transistor M2 is turned on to resume the normal operation.

The IGBT may then be turned on again for the normal operation. During the next off-period, the IGBT may experience additional power surge events. In this case, the transistors M3 and M4 are turned on again to dissipate the surge voltage. In the present example, within a single off-period, the surge voltage on the collector of the IGBT may cause the collector voltage to switch between the set voltage level and the reset voltage level multiple times. Each time the collector voltage exceeds the set voltage level, the protection gate drive circuit is enabled and each time the collector voltage drops below the reset voltage level, the protection gate drive circuit is disabled. In this manner, the protection gate drive circuit may be enabled multiple times within a single off-period to discharge the power surge.

Figure 5:
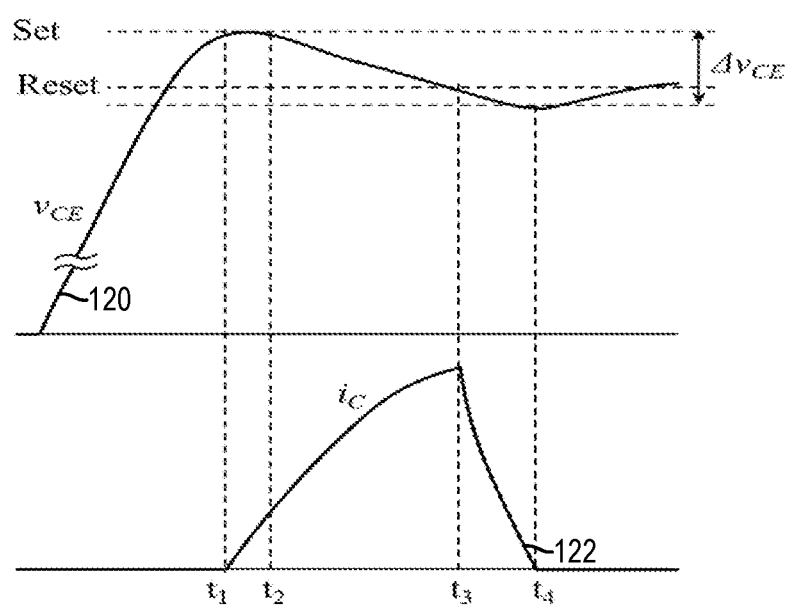
FIG. 5 illustrates the collector voltage and the collector current of the IGBT during a power surge event in some examples.

FIG. 5 illustrates the collector voltage and the collector current of the IGBT during a power surge event in some examples. Referring first to FIG. 2, the purpose of the protection circuit is to make the energy induced in the induction coil Lr to be consumed in the IGBT and to clamp the capacitor voltage Cr so that the collector voltage $V_{CE}$ does not increase over the IGBT voltage rating. Now turning to FIG. 5, the collector voltage $V_{CE}$ of the IGBT (curve 120) and the corresponding collector current $i_C$ (curve 122) are shown with the corresponding set and reset voltage levels used in the hysteresis over-voltage detection circuit. Note that the set and reset voltage levels shown in FIG. 5 are the corresponding voltage levels used in the hysteresis over-voltage detection circuit. The hysteresis over-voltage detection circuit receives a stepped down collector voltage for detection and the set and reset voltage levels used in the detection circuit are therefore corresponding stepped down voltage levels.

At time t1, a power surge appears at the collector terminal of the IGBT and the collector voltage increases to the set voltage level. The protection gate drive circuit is activated to turn on the IGBT at the clamped voltage level. The collector current $i_C$ begins to increase gradually with the clamped gate voltage being applied to the IGBT. The current flow direction of the coil current $i_{Lr}$ changes direction. Instead of circulating between the induction coil Lr and the capacitor Cr, the coil current $i_{Lr}$ flows towards the IGBT to be dissipated by the IGBT to ground. The collector voltage $V_{CE}$ is therefore clamped and do not increase further. When current $i_C$ becomes equal to current $i_{Lr}$ at time t2, the voltage $V_{CE}$ begins to fall by the discharge of capacitor Cr and the voltage decrease slope is decided by the collector current $i_C$ and the capacitance value of capacitor Cr. Once the voltage $V_{CE}$ reaches the reset level at time t3, the protection gate drive circuit is disabled and the collector current $i_C$ is turned off by a soft gate control to obtain a safe shutdown. The current falling time interval (t3-t4) makes the voltage $V_{CE}$ drop a little more below the reset level. Once the protection interval is completed at time t4, the IGBT returns to normal operation.

Figure 6:
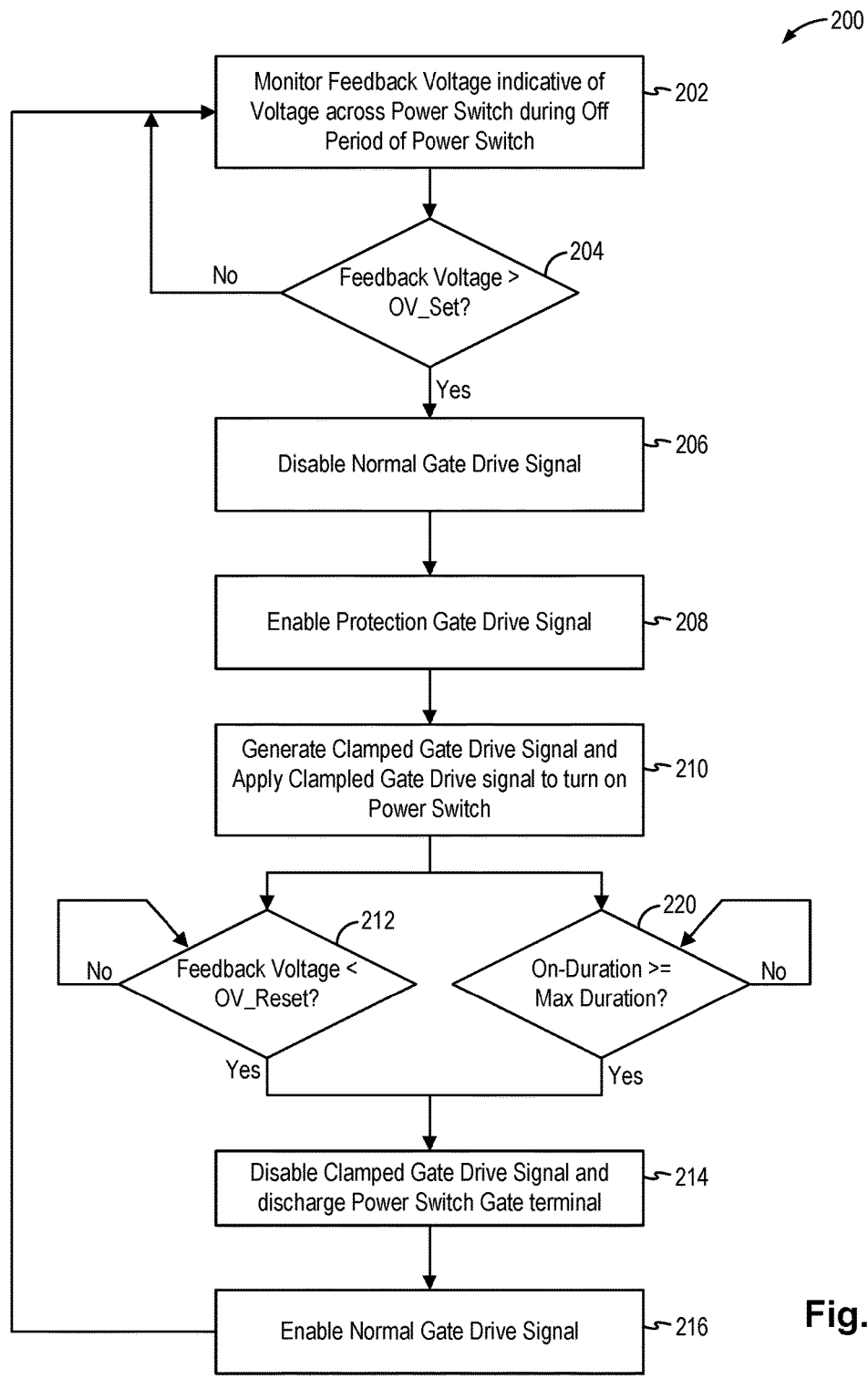
FIG. 6 is a flowchart illustrating a method for providing overvoltage or short-circuit protection for the power switching device in a quasi-resonant inverter circuit in embodiments of the present invention.

FIG. 6 is a flowchart illustrating a method for providing overvoltage or short-circuit protection for the power switching device in a quasi-resonant inverter circuit in embodiments of the present invention. Referring to FIG. 6, an over-voltage protection method 200 monitors a feedback voltage indicative of the voltage across the power switch during an off-period of the power switch (202). The feedback voltage is compared against an over-voltage set level OV_Set (204). In response to the feedback voltage being less than the OV_Set level, the method continues to monitor the feedback voltage indicative of the voltage across the power switch. On the other hand, in response to the feedback voltage being greater than the OV_Set level, the method 200 disables the normal gate drive signal (206). For example, the method 200 turns off the NMOS transistor M2 in the normal gate drive circuit that is driving the power switch to be in the off state. Then, the method 200 enables the protection gate drive signal (208). For example, the PMOS transistor M3 and the NMOS transistor M4 in the protection gate drive circuit are both turned on to form a voltage divider with impedances Z3 and Z4. The method 200 thus generates a clamped gate drive signal with a clamped gate voltage value (210). The clamped gate drive signal is applied to turn on the power switch. With the power switch turned on by the clamped gate drive signal, the method 200 monitors the feedback voltage to determine if the feedback voltage has decreased below a reset voltage level OV_Reset (212). The reset voltage level OV_Reset is lower than the set voltage level OV_Set. When the feedback voltage is below the reset voltage level, the method 200 disables the clamped gate drive signal and discharges the power switch gate terminal (214). The method 200 then enables the normal gate drive circuit (216) and the method returns to monitor the feedback voltage indicative of the voltage across the power switch during an off-period of the power switch (202).

In some embodiments, in parallel with monitoring the feedback voltage to determine if the feedback voltage has decreased below a reset voltage level OV_Reset (212), the method 200 also monitor a time duration for which the power switch has been turned on using the clamped gate drive signal. More specifically, the method 200 monitors the on-duration of the power switch to determine if the on-duration has reached or exceeded a maximum duration (220). At the expiration of the maximum duration, also referred to as the one-shot duration, the method 200 proceeds to turn off the clamped gate drive signal (214) even if the feedback voltage has not fallen below the reset voltage level OV_Reset. The method 200 continues by enabling the normal gate drive circuit (216) and the method returns to monitor the feedback voltage indicative of the voltage across the power switch during an off-period of the power switch (202).

Hard Turn-on Disable and Two-Level Protection Control

As described above, during the normal operation of the single switch quasi-resonant inverter, the power switch M0 (IGBT) is turned on and off alternately in response to the gate drive signal $V_{gctrl}$ to control the amount of electric current flowing in the induction coil Lr, which induces an electric current in the load pot, thereby controlling the amount of heat generated. The gate drive signal $V_{gctrl}$ is derived from the system input signal $V_{IN}$ which controls the on and off switch cycle of the power switch M0. The system input signal $V_{IN}$ is provided to drive the power switch to turn on and off at a given switching frequency, such as 30 kHz, to obtain the desired power output at the quasi-resonant inverter. The input signal $V_{IN}$ can be a PWM signal, or a clock signal switching between on period and off period.

During the off-period of the power switch M0, no current flow through the power switch M0. Instead, the current $i_{Lr}$ circulates between the induction coil Lr and the resonant capacitor Cr. However, at this time, the voltage across the power switch M0 can reach a high peak voltage value, such as 1 kV. When the power switch M0 is an IGBT, the IGBT sustains the high peak voltage across the collector and emitter terminals. In other words, during the off-period of the IGBT, the collector-to-emitter voltage $V_{CE}$ of the IGBT can reach up to 1 kV. During the IGBT off-period, noise may be coupled back to the host system that generates the system input signal $V_{IN}$ to cause the system input signal $V_{IN}$ to trigger erroneously. That is, the system input signal $V_{IN}$ can get driven high and low by noise to generate false signal levels, which leads to the gate drive signal $V_{gctrl}$ being driven above the threshold voltage and the IGBT being turned on unintentionally during the supposedly off-period.

When the power switch is erroneously turned on during the off-period, the power switch experiences hard switching or hard turn on because the voltage across the power switch may be at a high voltage value. Hard switching of the power switch is undesirable as it negatively impacts the efficiency and reliability of the power switch.

In embodiments of the present invention, a controller for driving a power switch incorporates a hard turn-on disable (HTOD) circuit to prevent the power switch from turning on when the power switch is sustaining a high voltage value. The hard turn-on disable circuit includes a hard turn-on detection circuit and a protection logic circuit. The hard turn-on detection circuit is configured to monitor the voltage across the power switch and to generate a detection indicator signal indicative of a high voltage across the power switch and based on the state of the detection indicator signal, the protection logic circuit is configured to either block or to pass the system input signal $V_{IN}$ to the normal gate drive circuit of the power switch. In particular, the protection logic circuit blocks the system input signal $V_{IN}$ in response to a high voltage detection so that the power switch M0 ignores the system input signal $V_{IN}$, which may be erroneous, and the power switch is prevented from being turned on while the power switch is driven to a high voltage level. In this manner, the hard turn-on disable circuit is operative to prevent hard switching of the power switch which can occur during abnormal system conditions, such as AC supply swell or malfunctioning control signals which may cause mistriggering of the system input signal.

In embodiments of the present invention, the controller is applied to drive a power switch incorporated in a single switch quasi-resonant inverter for induction heating applications. With the hard turn-on disable circuit incorporated in the controller, the power switch is prevented from being turned on when the power switch is driven to a high voltage to avoid hard switching. However, in some cases, an excessive abnormal voltage, such as from a lightening surge, may be applied to the AC input line of induction heating system. The filtered DC voltage $V_{Cf}$ being applied to the induction coil Lr can be increased by several hundred volts even though surge absorbing circuit suppresses the excessive input voltages. The voltage across the power switch (IGBT)—the collector-to-emitter voltage $V_{CE}$—can be increased to above 1.5 kV or even more, and the $V_{CE}$ voltage may exceed the dynamic breakdown voltage of conventional IGBT devices. In that case, instead of preventing the power switch from being turned on under the HTOD protection scheme, it is actually advantageous to apply the over-voltage protection scheme described above with reference to FIGS. 2-6 to softly turn on the power switch to dissipate the excessive voltage.

Accordingly, in some embodiments, a controller for driving a power switch implements a two-level protection scheme where the power switch is protected from hard switching as well as being protected from damages from power surges or over-voltage conditions. In embodiments of the present invention, a controller for driving a power switch incorporates a two-level protection circuit implementing a two protection schemes for the power switch. In particular, the two-level protection circuit implements a first level protection providing a hard turn-on disable (HTOD) protection scheme to prevent the power switch from hard switching or hard turn-on due to system input signal mistriggering. The two-level protection circuit further implements a second level protection providing an over-voltage clamp protection (OVCP) scheme to protect the power switch from over-voltage conditions or power surge events, such as lightning events. The HTOD protection scheme prevents faulty turn on of the power switch to avoid hard switching. Preventing hard switching or hard turn-on of the power switch improves noise immunity and efficiency of operation. Meanwhile, the OVCP protection scheme, which is described above with reference to FIGS. 2-6, causes the power switch to softly turn on during the off-period of the power switch to dissipate the over-voltage. The OVCP protection scheme prevents the power switch from going beyond its dynamic breakdown voltage and keep the power switch in the safe operating area. As thus configured, the two protection schemes operate in conjunction to improve the noise immunity, efficiency, and reliability of the power switch.

More specifically, the two level protection circuit implements the two protection schemes by detecting the voltage across the power switch during the off-period of the power switch. When the power switch is an IGBT, the two level protection circuit is implemented by detecting the collector voltage at the IGBT, or the collector-to-emitter voltage $V_{CE}$ at the IGBT. During the off-period of the power switch, the voltage across the power switch, or a voltage indicative thereof, is monitored. In response to the voltage across the power switch rising above a first voltage level, the hard turn-on disable (HTOD) protection scheme is activated to prevent the power switch from being turned on during the off-period, regardless of the state of the system input signal $V_{IN}$. However, when the voltage across the power switch continues to increase and reaches a second voltage level, the over-voltage clamp protection (OVCP) scheme is activated which overrides the HTOD protection scheme and causes soft turn-on of the power switch to dissipate the over-voltage, thereby keeping the voltage across the power switch within the safe operating range. In particular, when the OVCP scheme is activated, the protection circuit turns on the power switch during the switch off-period with active clamping of the gate voltage. In this manner, the power surge can be dissipated from the power switch without irrevocably damaging the power switch.

In one embodiment, the protection circuit activates the HTOD protection scheme during the switch off-period when the voltage across the power switch exceeds 400V. In the 400-1 kV voltage range, the HTOD protection scheme is activated to prevent the power switch from being turned on erroneously. That is, even if the system input signal $V_{IN}$ is asserted, the HTOD protection scheme operates to prevent the power switch from being turned on as the voltage across the power switch is high.

Then, if the voltage across the power switch increases beyond 1 kV during the switch off-period, the protection circuit overrides the HTOD protection scheme and activates the OVCP protection scheme where the power switch is turned on softly with the gate voltage of the power switch clamped at a given gate voltage value to dissipate the power surge. As described above with reference to FIGS. 2-6, the OVCP protection scheme uses the protection gate driver circuit (transistors M3 and M4) to softly turn on the power switch, instead of the normal gate drive circuit.

Figure 7:
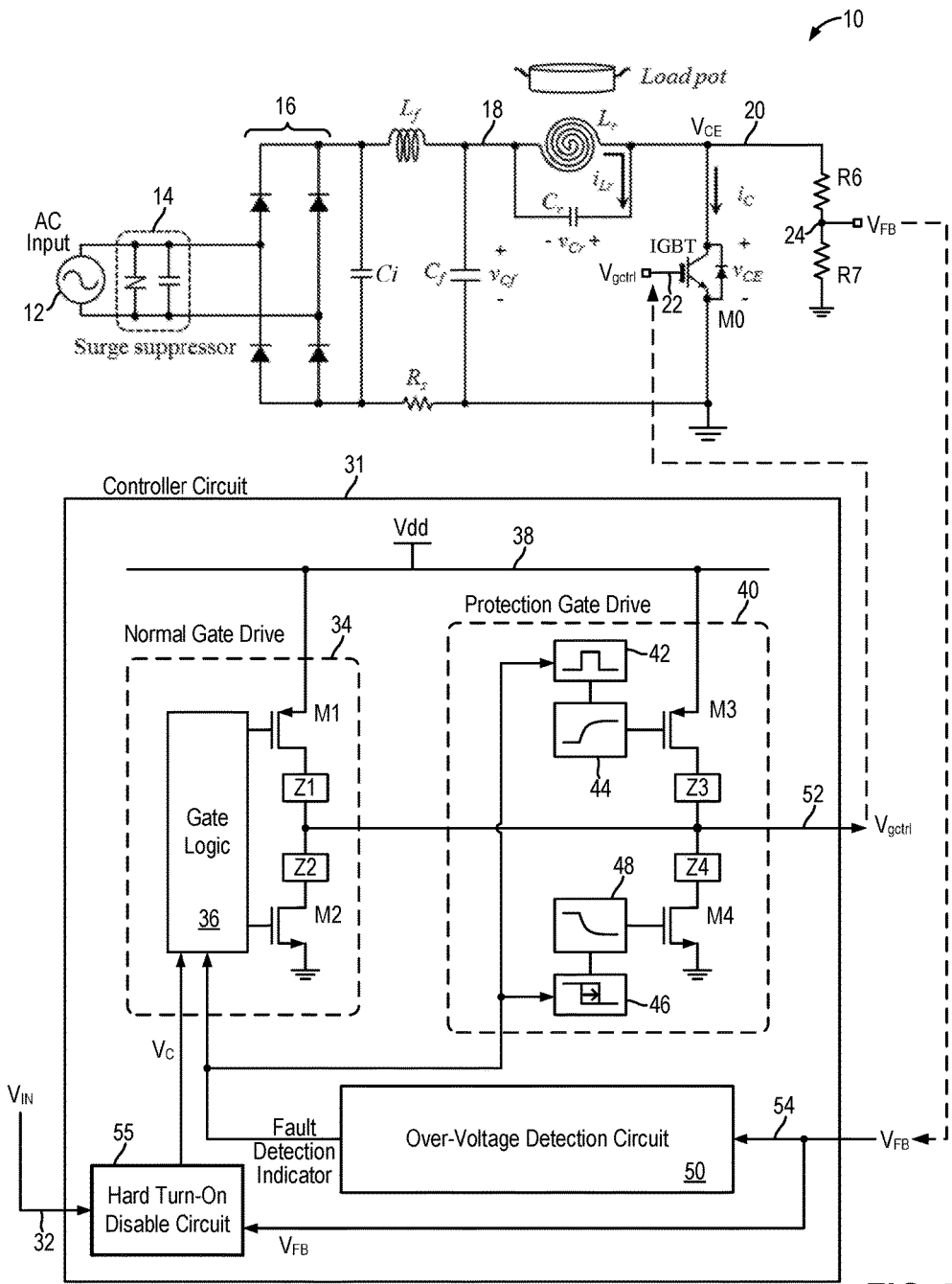
FIG. 7 is a block diagram of a controller circuit implementing a two-level protection scheme including two protection schemes coupled to drive the power switch in a single switch quasi-resonant inverter for induction heating application in embodiments of the present invention.

FIG. 7 is a block diagram of a controller circuit implementing a two-level protection scheme including two protection schemes coupled to drive the power switch in a single switch quasi-resonant inverter for induction heating application in embodiments of the present invention. The controller circuit of FIG. 7 is configured in the same manner as the controller circuit 30 of FIG. 2 with the addition of the hard turn-on disable circuit. Like elements in FIGS. 2 and 7 are given like reference numerals and will not be described in detail. Referring to FIG. 7, the single switch quasi-resonant inverter 10 of FIG. 1 is driven by a controller circuit 31 to switch the power switch M0 on and off to conduct current alternately through the induction coil Lr. In the present embodiment, the power switch M0 is an IGBT having a gate as the control terminal and collector and emitter terminals as the power terminals. In the following description, the controller circuit will be described as driving the IGBT as the power switch M0. The present description is illustrative only and not intended to be limiting. It is understood that the power switch M0 can be implemented using other power switching devices other than an IGBT. A power switch or a power switching device includes a control terminal or a gate terminal receiving a control signal or a gate drive signal and a pair of power terminals conducting currents.

In embodiments of the present invention, the controller circuit 31 includes a normal gate drive circuit 34 and an OVCP circuit formed by a protection gate drive circuit 40 and a fault detection circuit 50. In the present embodiment, the fault detection circuit 50 is constructed as an over-voltage detection circuit configured to detect an over-voltage condition or excessive voltage event at the collector terminal (node 20) of the IGBT or an excessive collector-to-emitter voltage $V_{CE}$ at the IGBT. The protection gate drive circuit 40 and the fault detection circuit 50 operate in conjunction to implement the OVCP protection scheme in the manner described above with reference to FIG. 2 and subsequent figures.

The controller circuit 31 further includes a hard turn-on disable (HTOD) circuit 55 configured to receive the system input voltage $V_{IN}$ (node 32) and the feedback voltage V on an input node 54 indicative of the collector-to-emitter voltage $V_{CE}$ of the IGBT, or the voltage across the power terminals of the power switch M0. The feedback voltage $V_{FB}$ (node 24) is coupled to the HTOD circuit 55 to detect for a high voltage condition at the power switch M0. In some embodiments, the HTOD circuit 55 is operative to detect the voltage across the power switch during the off-period of the IGBT. The HTOD circuit 55 generates a control signal $V_C$ as an output signal coupled to drive the gate logic 36 in the normal gate drive circuit 34. The control signal $V_C$ is operative to either pass the system input signal $V_{IN}$ to the normal gate drive circuit 34 or block the system input signal $V_{IN}$ from being passed to the normal gate drive circuit. That is, when the HTOD circuit 55 is not activated, the system input voltage $V_{IN}$ is passed through to the gate logic 36 which enables the normal gate drive circuit 34 to drive the power switch on and off based on the system input signal $V_{IN}$. On the other hand, when the HTOD circuit 55 is activated in response to detecting a high voltage across the power switch, the HTOD circuit 55 blocks the system input voltage $V_{IN}$ from being passed to the gate logic 36. The normal gate drive circuit 34 will not drive the power switch on and off regardless of the state of the system input signal $V_{IN}$. In this manner, hard switching of the power switch M0 is prevented.

Figure 8:
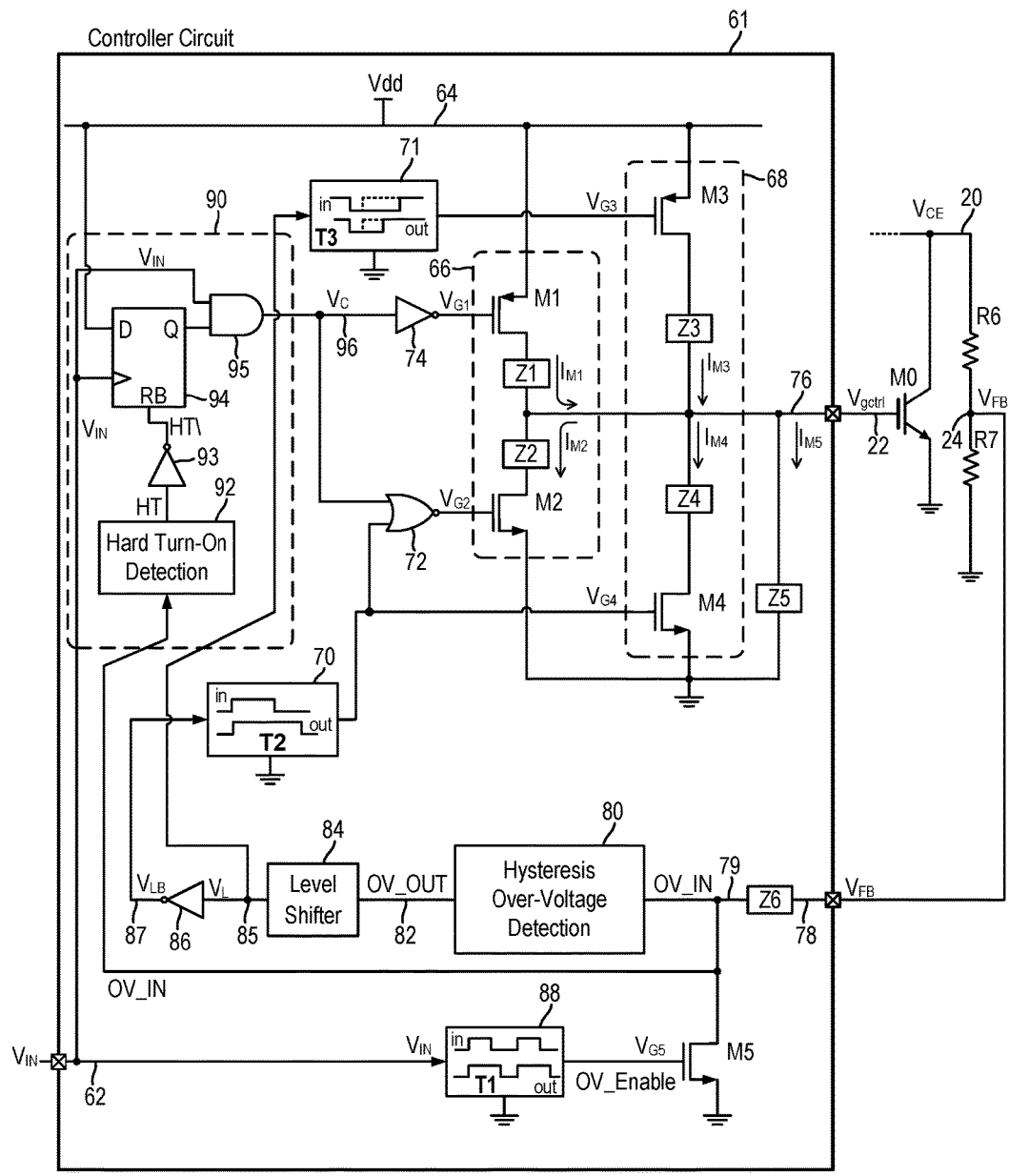
FIG. 8 is a circuit diagram illustrating the construction of the controller circuit of FIG. 7 in embodiments of the present invention.

FIG. 8 is a circuit diagram illustrating the construction of the controller circuit of FIG. 7 in embodiments of the present invention. The controller circuit of FIG. 8 is configured in the same manner as the controller circuit 60 of FIG. 3 with the addition of the hard turn-on disable circuit. Like elements in FIGS. 3 and 8 are given like reference numerals and will not be described in detail. Referring to FIG. 8, a controller circuit 61 for driving the gate terminal (node 22) of an IGBT includes a normal gate drive circuit 66 and a protection gate drive circuit 68. The controller circuit 61 also includes a hysteresis over-voltage detection circuit 80 configured to detect an over-voltage condition or excessive voltage event at the collector terminal (node 20) of the IGBT or an excessive collector-to-emitter voltage $V_{CE}$ at the IGBT. The protection gate drive circuit 68 and the hysteresis over-voltage detection circuit 80 implements the OVCP protection scheme where the protection gate drive circuit 68 is activated in response to the fault detection indicator signal OV_OUT (node 82) indicating an over-voltage condition being detected at the power switch M0. The protection gate drive circuit 68 turns on the IGBT (power switch M0) softly and clamp the gate voltage of the IGBT at a given gate voltage value. The construction and operation of the protection gate drive circuit 68 and the hysteresis over-voltage detection circuit 80 has been described above in detail and will not be repeated.

The controller circuit 61 further includes a hard turn-on disable (HTOD) circuit 90 to protect the IGBT from hard switching, that is, to prevent the IGBT from being turned on erroneously by noise in the system input signal $V_{IN}$ when the voltage across the IGBT is at a high voltage level. In the controller circuit 60 of FIG. 3, without the HTOD circuit, the normal gate drive circuit 66 receives the system input signal $V_{IN}$ (node 62) directly through logic gates 72, 74. However, in the controller circuit 61 of FIG. 8, the system input signal $V_{IN}$ is routed to the HTOD circuit 90 instead. The HTOD circuit 90 generates a control signal $V_C$ (node 96) as the output signal for driving the normal gate drive circuit 66 through logic gates 72,74. In this manner, the HTOD circuit 90 gates the system input signal $V_{IN}$ and determines whether the system input signal should or should not be passed to the normal gate drive circuit 66.

The hard turn-on disable circuit 90 includes a hard turn-on detection circuit 92 and a protection logic circuit formed by a D-flip-flop 94 and a logical AND gate 95. The hard turn-on detection circuit 92 is coupled to receive the over-voltage monitor signal OV_IN (node 79) which is indicative of the feedback voltage $V_{FB}$. In practice, the feedback voltage V is a divided down voltage of the collector-to-emitter voltage $V_{CE}$ of the IGBT. The hard turn-on detection circuit 92 therefore monitors the voltage $V_{CE}$ across the IGBT and determines when a high voltage level is reached at the collector terminal (node 20) of the IGBT or a high collector-to-emitter voltage $V_{CE}$ is reached at the IGBT. In some embodiments, the hard turn-on detection circuit 92 is operative only during the off-period of the IGBT. As described above, the NMOS transistor M5 is coupled to node 79 to enable or disable the over-voltage monitor signal OV_IN in response to the system input signal $V_{IN}$. When the system input signal is at a logical high (switch on-period), the OV_Enable signal $V_{G5}$ is driven high to turn on NMOS transistor M5 to ground node 79. On the other hand, when the system input signal is at a logical low (switch off-period), the OV_Enable signal $V_{G5}$ is driven low to turn off NMOS transistor M5 so that the over-voltage monitor signal OV_IN (node 79) follows the feedback voltage $V_{FB}$.

The hard turn-on detection circuit 92 generates a high voltage indicator signal HT as the output signal. The high voltage indicator signal HT is asserted when the over-voltage monitor signal OV_IN exceeds a first threshold voltage level. In some embodiments, the hard turn-on detection circuit 92 is a hysteresis detection circuit including a HTOD set voltage level and a HTOD reset voltage level. The high voltage indicator signal HT is asserted when the over-voltage monitor signal OV_IN exceeds the HTOD set voltage level and the high voltage indicator signal HT is deasserted when the over-voltage monitor signal OV_IN drops below the HTOD reset voltage level. Moreover, in some embodiments, the high voltage indicator signal HT is at a logical low level when deasserted and at a logical high level when asserted.

The high voltage indicator signal HT is coupled to the protection logical circuit. In particular, the high voltage indicator signal HT is coupled to the Reset terminal RB of the D-flip-flop 94. In the present embodiment, the Reset terminal of the D-flip-flop 94 is an active low terminal. That is, the D-flip-flop 94 is put in a reset state when the Reset terminal RB is driven to a logical low level. Accordingly, the high voltage indicator signal HT is coupled to an inverter 93 to be inverted and the inverted signal HT/ is provided to the Reset terminal RB. In other embodiments, the Reset terminal of the D-flip-flop 94 is an active high terminal. In that case, inverter 93 is omitted and the high voltage indicator signal HT may be coupled directly to the Reset terminal of the D-flip-flop 94.

The D-flip-flop receives the positive power supply voltage Vdd as the data input D and the system input signal $V_{IN}$ as the clock input. Therefore, the data input D is always at a logical high and the data input D is passed to the data output Q of the D-flip-flop in response to the clock input $V_{IN}$. The data output Q of the D-flip-flop and the system input signal $V_{IN}$ are both coupled as input signals to the logical AND gate 95. The output signal of the AND gate 95 is the control signal $V_C$ (node 96). The control signal $V_C$ is coupled to the inverter 74 and to the NOR gate 72 to be provided to drive the normal gate drive circuit 66.

With the D-flip-flop 94 and the logical AND gate 95 thus configured, the control signal $V_C$ follow the system input signal $V_{IN}$ unless the D-flip-flop 94 is in reset mode. This is because the data output Q of the D-flip-flop 94 generates the same logical output values as the system input signal $V_{IN}$. However, when the D-flip-flop 94 is in reset mode, the data output Q is at a logical low and the AND gate 95 is disabled and the system input signal $V_{IN}$ is blocked from being passed to the output of the AND gate 95. The control signal $V_C$ is held at a logical low level and the normal gate drive circuit 66 will not be activated at all regardless of the state of the system input signal $V_{IN}$.

The operation of the HTOD circuit 90 is as follows. The hard turn-on detection circuit 92 monitors the feedback voltage V indicative of the collector-to-emitter voltage of the IGBT. In particular, the hard turn-on detection circuit 92 monitors the over-voltage monitor signal OV_IN (node 79). The hard turn-on detection circuit 92 compares the over-voltage monitor signal OV_IN to the first threshold voltage level. In one example, the first threshold voltage level corresponds to about 400V of the collector-to-emitter voltage of the IGBT. In the case the hard turn-on detection circuit 92 is a hysteresis detection circuit, the hard turn-on detection circuit 92 compares the over-voltage monitor signal OV_IN to the HTOD set voltage level and the HTOD reset voltage level, the HTOD set voltage level being higher than the HTOD reset voltage level. In one example, the HTOD set voltage level corresponds to about 400V of the collector-to-emitter voltage of the IGBT and the HTOD reset voltage level corresponds to about 350V of the collector-to-emitter voltage of the IGBT. When the over-voltage monitor signal OV_IN is lower than the HTOD set voltage level, the HT signal is at a logical low and the Reset terminal RB of the D-flip-flop 94 is not asserted. Therefore, the system input signal $V_{IN}$ is passed through the D-flip-flop 94 and the AND gate 95 as the control signal $V_C$. In this case, the normal gate drive circuit 66 responds to the system input signal $V_{IN}$ to generate the gate drive signal $V_{gctrl}$ to switch the IGBT on and off.

When the over-voltage monitor signal OV_IN increases above the HTOD set voltage level, the HT signal is asserted to a logical high level and the Reset terminal RB of the D-flip-flop 94 is asserted and the D-flip-flop 94 is put in reset mode. The output signal Q of the D-flip-flop 94 is held at the reset level—logical low. The AND gate 95 is in a block state and the control signal $V_C$ is held low, regardless of the system input signal $V_{IN}$. In this case, the normal gate drive circuit 66 held the IGBT in an off-state (PMOS transistor M1 turned off and NMOS transistor M2 turned on). Accordingly, when the voltage across the IGBT is above the HTOD set voltage level, the HTOD circuit 90 operates to block the system input signal $V_{IN}$ from reaching the normal gate drive circuit to prevent hard switching on of the IGBT. Therefore, even if noise coupling causes the system input signal $V_{IN}$ to mistrigger, the erroneous system input signal pulses will be blocked and will not reach the power switch to cause the power switch to turn on unintentionally.

In some embodiments, the HTOD circuit 90 further includes a timer circuit to monitor the duration of the high voltage indicator signal HT being asserted. When the high voltage indicator signal HT is asserted for a duration longer than a preset fixed time duration, an alert signal or a flag is generated and transmitted to the host system and the controller circuit 61 may initiate remedial measures, such as shutting off the power switch (IGBT) entirely. In some embodiments, the preset fixed time duration is 35 µs minimum and 70 µs typical.

The hard turn-off detection circuit 92 continues to monitor the over-voltage monitor signal OV_IN. The high voltage indicator signal HT remain asserted until the over-voltage monitor signal OV_IN decreases below the HTOD reset voltage level. When the over-voltage monitor signal OV_IN becomes lower than the HTOD reset voltage level, the high voltage indicator signal HT is deasserted to a logical low level and the Reset terminal RB of the D-flip-flop 94 is deasserted and the D-flip-flop 94 is no longer in reset mode. The D-flip-flop 94 operates to pass the system input signal $V_{IN}$ to the data output Q and the AND gate 95 receives the same signals on both of its input terminals and the AND gate 95 generates the control signal $V_C$ which mirrors the system input signal $V_{IN}$. The control signal $V_C$ is coupled to drive the normal gate drive circuit 66. Accordingly, the normal gate drive circuit 66 responds to the system input signal $V_{IN}$ to generate the gate drive signal $V_{gctrl}$ to switch the IGBT on and off in normal operation.

As thus configured, the controller circuit 61 implements a two-level protection scheme for the power switch M0. The hard turn-on disable circuit 90 operates as described above to prevent the IGBT from being turned on when the collector-to-emitter voltage $V_{CE}$ is above the first threshold voltage level or the HTOD set voltage level (e.g., corresponding to an IGBT collector voltage of 400V). However, in the event that the collector-to-emitter voltage $V_{CE}$ continues to increase and the over-voltage monitor signal OV_IN passes the over-voltage set voltage level (e.g., corresponding to an IGBT collector voltage of 1000V), the hard turn-on disable circuit 90 will be overridden and the OVCP protection scheme is activated to dissipate the voltage surge. As described above, the NMOS transistor M2 of the normal gate drive circuit 66 will be deactivated by NOR gate 72 so that the gate terminal of the IGBT is not being driven by the normal gate drive circuit 66. The protection gate drive circuit 68 is then activated. Transistors M3 and M4 in the protection gate drive circuit 68 are turned on simultaneously and combined with impedance Z3 and Z4 to generate a soft rise of the gate drive signal $V_{gctrl}$ beyond the threshold voltage of the IGBT. Meanwhile, the protection gate drive circuit 68 clamps the gate drive signal $V_{gctrl}$ at a maximum voltage value given by Equation (1) above. In this manner, the IGBT is turned on with the gate voltage clamped to safely dissipate the excessive voltage at the collector terminal to ground.

When the over-voltage monitor signal OV_IN decreases below the over-voltage reset voltage level, as detected by the hysteresis over voltage detection circuit 80, the OVCP protection scheme first deactivates PMOS transistor M3 in the protection gate drive circuit 68 while the time controller 70 keeps NMOS transistor M4 on for a duration T2 to realize a soft turn off. After the time duration T2 expires, the NMOS transistor M2 in the normal gate drive circuit 66 turns back on to provide the strong pull low for the gate drive voltage node 76 while NMOS transistor M4 turns off.

Figure 9:
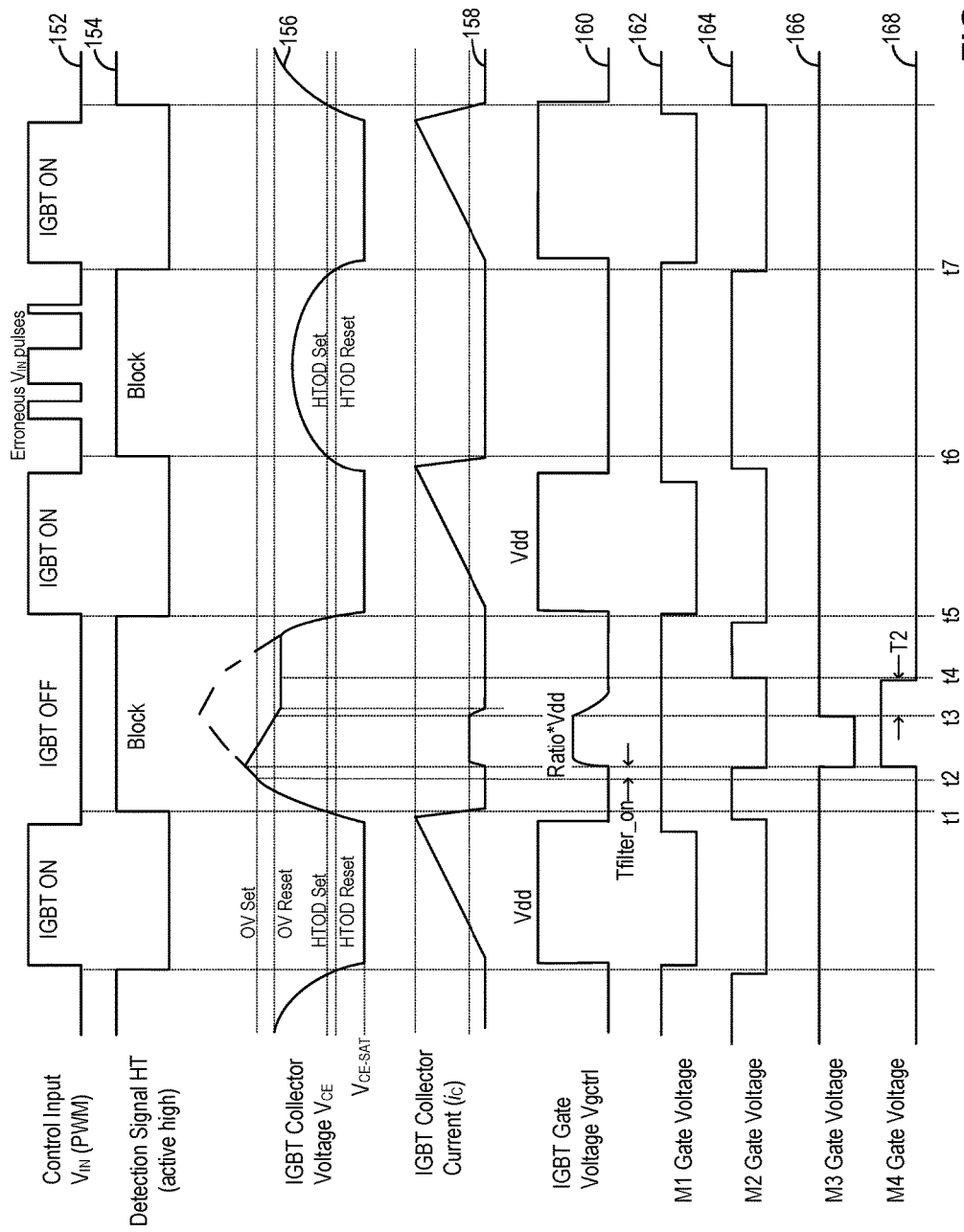
FIG. 9 is a timing diagram illustrating the operation of the controller circuit of FIG. 8 in some examples.

FIG. 9 is a timing diagram illustrating the operation of the controller circuit of FIG. 8 in some examples. Referring to FIG. 9, the input signal $V_{IN}$ (curve 152) is a PWM signal to turn the IGBT on and off to conduct current alternately through the induction coil. The high voltage indicator signal HT (curve 154) is generated by the HTOD protection circuit 90 to block the system input signal $V_{IN}$ from passing to drive the IGBT when the collector voltage at the IGBT is too high. In normal operation, the gate voltage $V_{gctrl}$ of the IGBT (curve 160) switches between ground and the power supply voltage Vdd to turn the IGBT on and off. Meanwhile, the collector current $i_C$ (curve 158) increases linearly during the on-period of the IGBT and then decreases to zero during the off-period of the IGBT. In normal operation, the gate control signals for transistors M1 and M2 (curves 162 and 164) have a logical low levels during the on-period and have a logical high levels during the off-period of the IGBT. In normal operation, the gate control signal for transistor M3 (curve 166) is at a logical high level while the gate control signal for the transistor M4 (curve 168) is at a logical low level to disable the protection gate drive circuit.

During the on-period of the IGBT, the collector-to-emitter voltage $V_{CE}$ (curve 156) is driven to the collector-emitter saturation voltage $V_{CE\text{-}SAT}$. However, when the IGBT is turned off, the collector voltage can increase to a large voltage value, such as 600V. The IGBT typically has a voltage rating of 1.7 kV and can withstand the normal collector voltage excursion during the normal operation of the IGBT.

The hard turn-on detection circuit and the hysteresis over-voltage detection circuit both monitor the collector voltage $V_{CE}$ of the IGBT during the off period of the IGBT. At time t1, the collector voltage $V_{CE}$ of the IGBT exceeds the HTOD set voltage level. In one example, the HTOD set voltage level correspond to about 400V of collector voltage. As a result, the high voltage indicator signal HT is asserted and the HTOD protection circuit blocks the system input signal $V_{IN}$ from passing to the normal gate drive circuit.

However, at time t2, certain power surge event causes the collector voltage $V_{CE}$ to exceed the set voltage level of the hysteresis over-voltage detection circuit. In one example, the set voltage level correspond to about 1.4 kV of collector voltage. The hysteresis over-voltage detection circuit asserts the fault detection indicator signal. Within a very short time, remediation measure is initiated. The gate control signal for transistor M2 is disabled (logical low) to turn off transistor M2. The gate control signal for transistor M3 is enabled (logical low) to turn on transistor M3 while the gate control signal for transistor M4 is enabled (logical high) to turn on transistor M4. As a result of transistors M3 and M4 being turned on, the gate voltage of the IGBT rises to the clamped gate voltage value defined by the Z3/Z4 voltage divider. The IGBT is turned on by the clamped gate voltage to conduct collector current $i_C$ to dissipate the power surge. As a result, the collector voltage $V_{CE}$ decrease.

At time t3, the collector voltage $V_{CE}$ decreases below the reset voltage level of the hysteresis over-voltage detection circuit. In one example, the reset voltage level correspond to about 1.2 kV of collector voltage. The hysteresis over-voltage detection circuit deasserts the fault detection indicator signal and transistor M3 is deasserted (logical high). Transistor M4 is kept on for the extended duration of T2 to discharge the gate voltage of the IGBT. At time t4, at the expiration of the duration T2, transistor M4 is turned off and transistor M2 is turned on to resume the normal operation.

At time t5, the collector voltage $V_{CE}$ decreases below the HTOD reset voltage level and the HTOD protection circuit deasserts the high voltage indicator signal HT and normal operation resumes.

At time t6, the collector voltage $V_{CE}$ of the IGBT exceeds the HTOD set voltage level. As a result, the high voltage indicator signal HT is asserted and the HTOD protection circuit blocks the system input signal $V_{IN}$ from passing to the normal gate drive circuit. During this time, noise or other system issue can cause erroneous system input signal pulses to be generated. Those signal pulses are not the intended system input signal pulses and the IGBT will suffer from hard switching if the IGBT is turned on with the high collector voltage across the power switch. However, the HTOD protection circuit of the present invention is activated to block the erroneous system input pulses.

At time t7, the collector voltage $V_{CE}$ decreases below the HTOD reset voltage level and the HTOD protection circuit deasserts the high voltage indicator signal HT and normal operation resumes.

Figure 10:
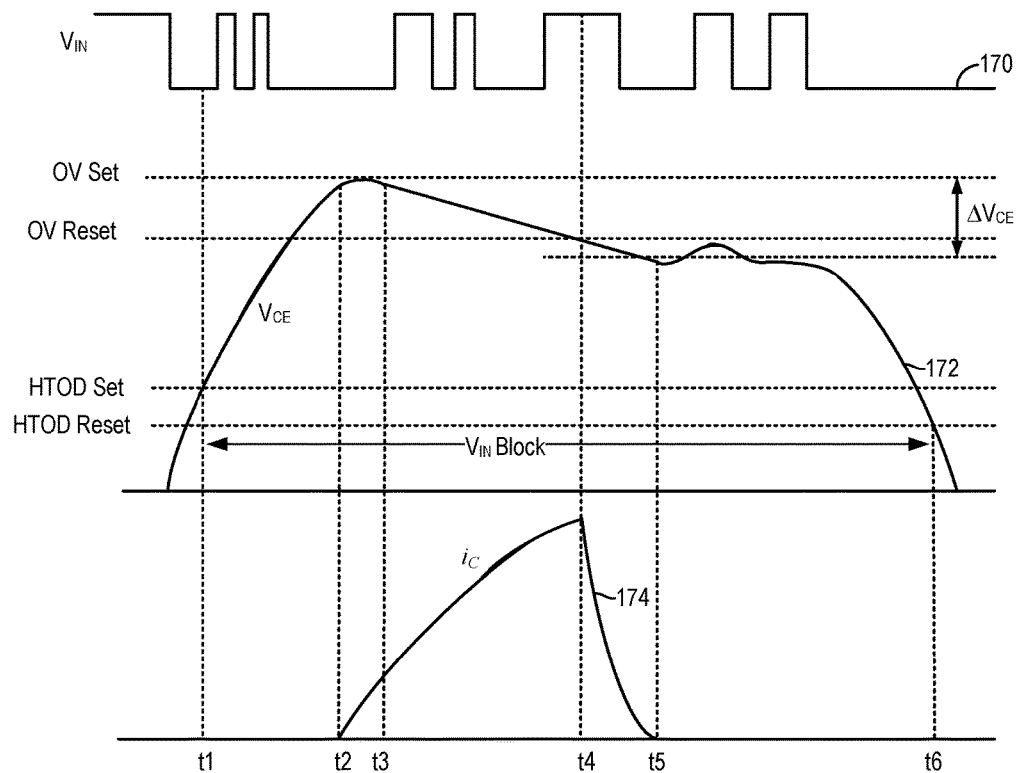
FIG. 10 illustrates the collector voltage and the collector current of the IGBT during a power surge event in some examples.

FIG. 10 illustrates the collector voltage and the collector current of the IGBT during a power surge event in some examples. Referring first to FIG. 7, the purpose of the HTOD protection circuit is to block the unwanted system input signal during the power switch off-period to prevent the power switch (IGBT) from hard switching. Meanwhile, the OVCP protection circuit is provided to make the energy induced in resonant inductor current Lr to be consumed in the IGBT and capacitor voltage Cr clamped in order that the collector voltage $V_{CE}$ does not increase over the damage level for the IGBT. Now turning to FIG. 10, the system input signal $V_{IN}$ (curve 170) is shows over a certain time period. The collector voltage $V_{CE}$ of the IGBT (curve 172) and the corresponding collector current $i_C$ (curve 174) are shown with the corresponding set and reset voltage levels used in the hysteresis over-voltage detection circuit and the HTOD protection circuit. Note that the set and reset voltage levels shown in FIG. 10 are the corresponding voltage levels used in the hysteresis over-voltage detection circuit and the HTOD protection circuit. The hysteresis over-voltage detection circuit and the HTOD protection circuit receives a stepped down collector voltage for detection and the set and reset voltage levels used in the detection circuits are therefore corresponding stepped down voltage levels.

At time t1, the collector voltage $V_{CE}$ is higher than HTOD set voltage level and the HTOD protection circuit is activated to block the system input signal $V_{IN}$. Therefore, although the system input signal $V_{IN}$ is toggling, the IGBT remains turned off.

However, at time t2, a power surge appears at the collector terminal of the IGBT and the collector voltage increases to the OV set voltage level. The protection gate drive circuit is activated to turn on the IGBT at the clamped voltage level. The collector current $i_C$ begins to increase gradually with the clamped gate voltage being applied to the IGBT. The current flow direction of the coil current $i_{Lr}$ changes direction. Instead of circulating between the induction coil Lr and the capacitor Cr, the coil current $i_{Lr}$ flows towards the IGBT to be dissipated by the IGBT to ground. The collector voltage $V_{CE}$ is therefore clamped and do not increase further. When current $i_C$ becomes equal to current $i_{Lr}$ at time t3, the voltage $V_{CE}$ begins to fall by the discharge of capacitor Cr and the voltage decrease slope is decided by the collector current $i_C$ and the capacitance value of capacitor Cr. Once the voltage $V_{CE}$ reaches the OV reset voltage level at time t4, the protection gate drive circuit is disabled and the collector current $i_C$ is turned off by a soft gate control to obtain a safe shutdown. The current falling time interval (t4-t5) makes the voltage $V_{CE}$ drop a little more below the OV reset voltage level.

When the OVCP protection interval is completed at time t5, the HTOD protection interval continues until time t6 when the collector voltage $V_{CE}$ drops below the HTOD reset voltage level. At time t6, the HTOD protection circuit is deactivated and the system input signal $V_{IN}$ will be allowed to pass through. The IGBT thus returns to normal operation.

Figure 11:
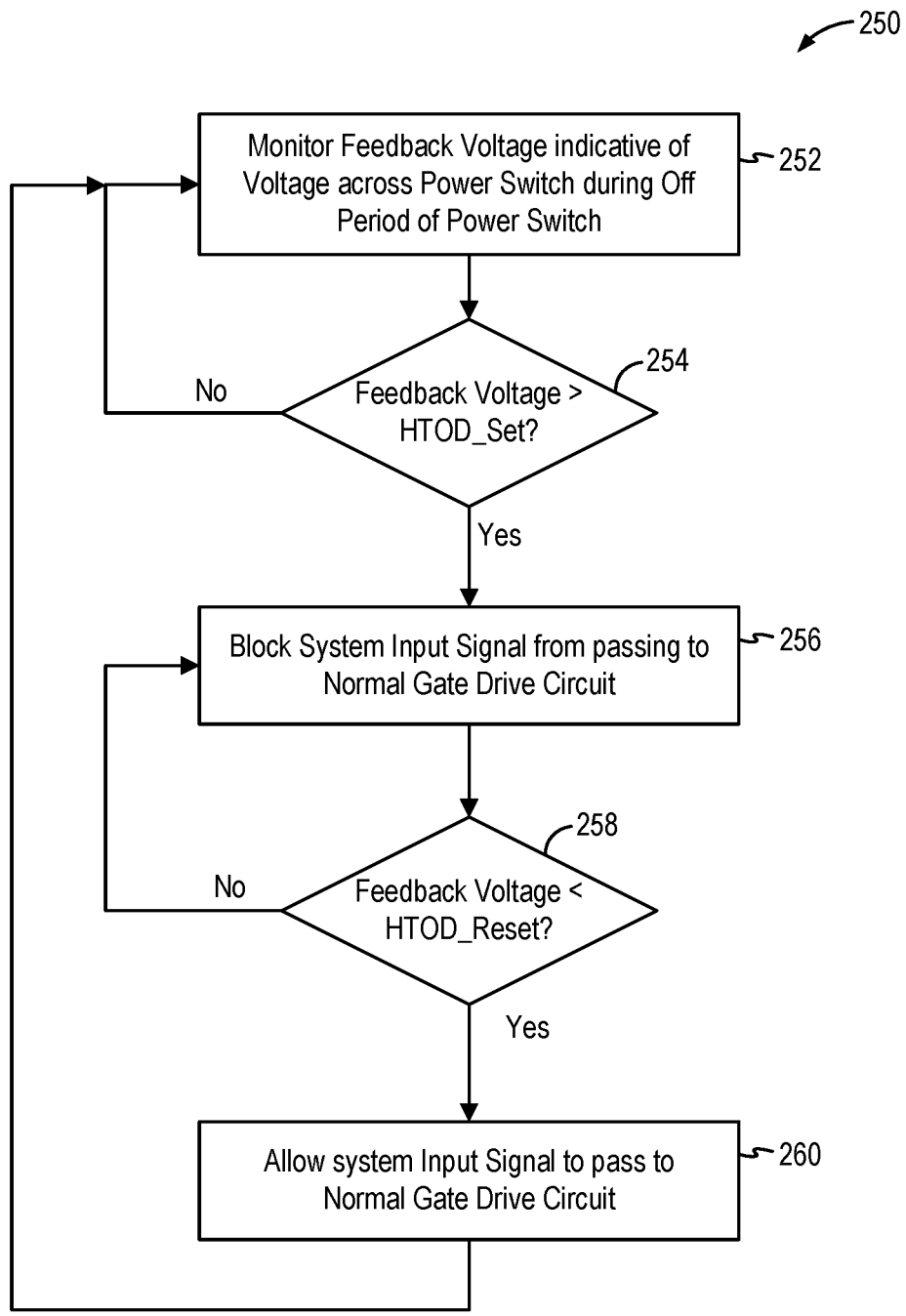
FIG. 11 is a flowchart illustrating a method for providing hard turn-on disable protection for the power switching device in a quasi-resonant inverter circuit in embodiments of the present invention.

FIG. 11 is a flowchart illustrating a method for providing hard turn-on disable protection for the power switching device in a quasi-resonant inverter circuit in embodiments of the present invention. Referring to FIG. 11, a hard turn-on protection method 250 monitors a feedback voltage indicative of the voltage across the power switch during an off-period of the power switch (252). The feedback voltage is compared against a HTOD set voltage level (254). In response to the feedback voltage being less than the HTOD set voltage level, the method 250 continues to monitor the feedback voltage indicative of the voltage across the power switch. On the other hand, in response to the feedback voltage being greater than the HTOD set voltage level, the method 250 blocks the system input signal from passing to the normal gate drive circuit (256). For example, the control signal $V_C$ driving the normal gate drive circuit can be held at a logical low level so that the normal gate drive circuit is disabled.

The method 250 continues to monitor the feedback voltage to determine if the feedback voltage has decreased below a HTOD reset voltage level (258). The HTOD reset voltage level is lower than the HTOD set voltage level. When the feedback voltage is below the HTOD reset voltage level, the method 250 allows the system input signal to be passed to the normal gate drive circuit for normal operation of the power switch (260). The method 250 returns to monitor the feedback voltage indicative of the voltage across the power switch during an off-period of the power switch (252).

Figure 12:
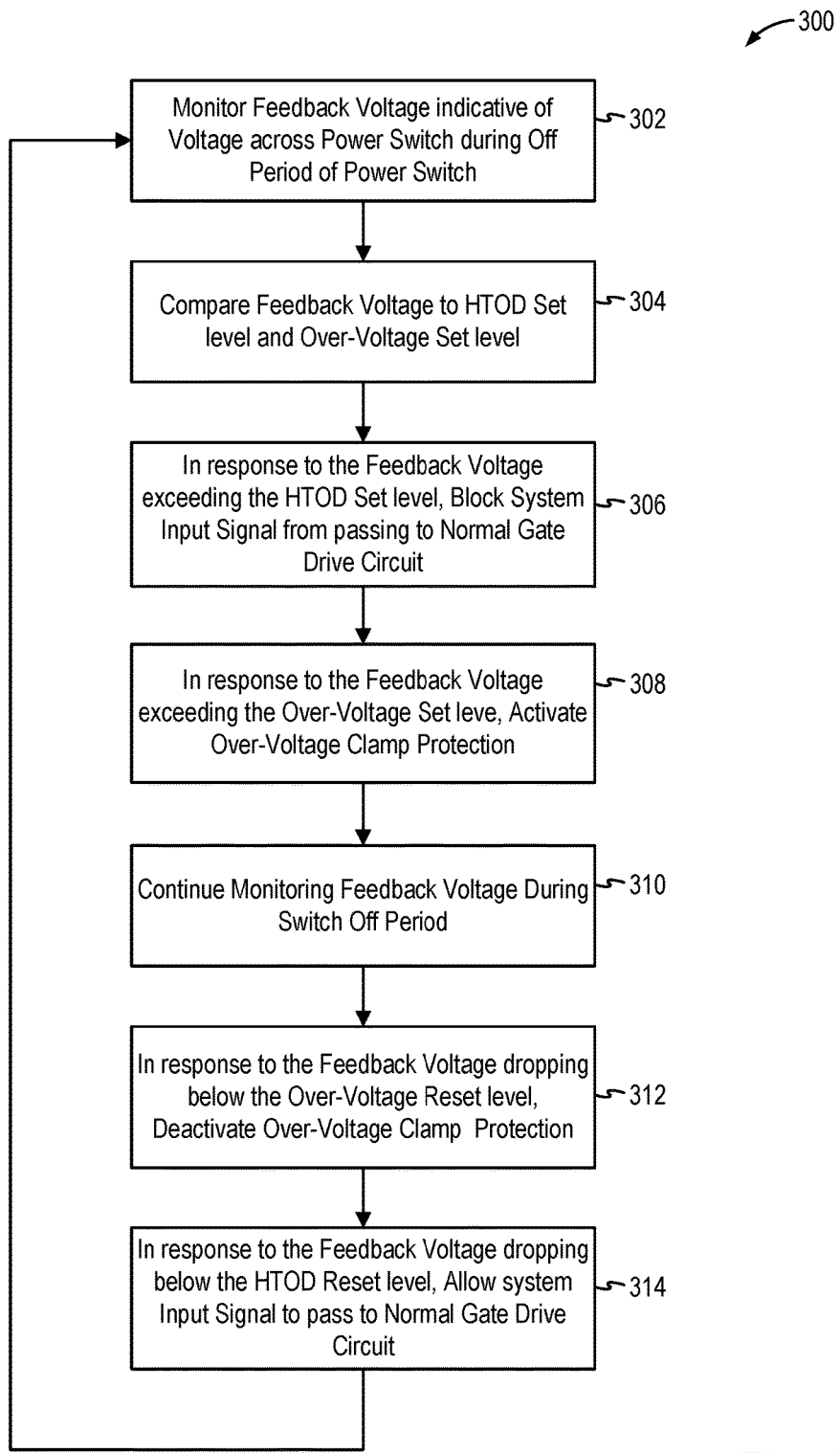
FIG. 12 is a flowchart illustrating a method for providing two-level protection for the power switching device in a quasi-resonant inverter circuit in embodiments of the present invention.

FIG. 12 is a flowchart illustrating a method for providing two-level protection for the power switching device in a quasi-resonant inverter circuit in embodiments of the present invention. Referring to FIG. 12, a two-level protection method 300 monitors a feedback voltage indicative of the voltage across the power switch during an off-period of the power switch (302). The feedback voltage is compared against a HTOD set voltage level and an over-voltage set voltage level OV_Set (304), the HTOD set voltage level being less than the over-voltage set voltage level. In response to the feedback voltage being less than the HTOD set voltage level, the method 300 continues to monitor the feedback voltage indicative of the voltage across the power switch. On the other hand, in response to the feedback voltage being greater than the HTOD set voltage level, the method 300 blocks the system input signal from passing to the normal gate drive circuit (306). For example, the control signal $V_C$ driving the normal gate drive circuit can be held at a logical low level so that the normal gate drive circuit is disabled.

The method 300 continues to monitor the feedback voltage. In response to the feedback voltage being greater than the over-voltage set voltage level, the method 300 activates the over-voltage clamp protection (OVCP) to softly turn on the power switch and to clamp the gate voltage of the power switch (308). In this manner, the excessive voltage at the power switch is dissipated.

The method 300 continues to monitor the feedback voltage (310). In response to the feedback voltage dropping below the over-voltage reset voltage level OV_Reset, the over-voltage clamp protection is deactivated (312). Furthermore, in response to the feedback voltage decreasing below the HTOD reset voltage level, the method 300 allows the system input signal to be passed to the normal gate drive circuit for normal operation of the power switch (314). The HTOD reset voltage level is lower than the over-voltage reset voltage level. The method 300 returns to monitor the feedback voltage indicative of the voltage across the power switch during an off-period of the power switch (302).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A controller circuit for generating a gate drive signal on an output node for driving a gate terminal of a power switch where the gate terminal controls the current flow between first and second power terminals of the power switch, the controller circuit comprising:

a first gate drive circuit configured to receive an input control signal and to generate a first output signal as the gate drive signal to drive the gate terminal of the power switch to turn on and off the power switch responsive to the input control signal, the first output signal having a first gate voltage value to drive the gate terminal of the power switch to turn on the power switch; and a hard turn-on disable circuit configured to generate the input control signal in response to a system input signal and a first voltage indicative of a voltage across the first and second power terminals of the power switch, the system input signal determining an on-period and off-period of the power switch, the hard turn-on disable circuit generating a high voltage indicator signal, the high voltage indicator signal being asserted in response to the first voltage exceeding a first threshold level and being deasserted otherwise, wherein while the power switch is in an off state in response to the system input signal and in response to the high voltage indicator signal being asserted, the hard turn-on disable circuit generates the input control signal having a first logical state to block the system input signal from being provided to the first gate drive circuit, and in response to the high voltage indicator signal being deasserted, the hard turn-on disable circuit generates the input control signal mirroring the system input signal to drive the first gate drive circuit.

2. The controller circuit of claim 1, wherein the hard turn-on disable circuit comprises a hysteresis detection circuit having a set voltage level and a reset voltage level, the set voltage level being higher than the reset voltage level, the hysteresis detection circuit asserting the high voltage indicator signal in response to the first voltage being at or above the set voltage level and deasserting the high voltage indicator signal in response to the first voltage being at or below the reset voltage level.

3. The controller circuit of claim 2, wherein the hard turn-on disable circuit further comprises a D-flip-flop having a data input terminal coupled to a positive power supply voltage, a clock input terminal coupled to the system input signal, a reset terminal coupled to a signal indicative of the high voltage indicator signal and generating an output signal, wherein the D-flip-flop is put in a reset mode in response to the high voltage indicator signal being asserted.

4. The controller circuit of claim 3, wherein the hard turn-on disable circuit further comprises a logical AND gate configured to receive the system input signal and the output signal of the D-flip-flop, the logical AND gate generating the input control signal.

5. The controller circuit of claim 1, wherein:
the first gate drive circuit comprises a first transistor, a first impedance, a second impedance and a second transistor connected in series between a positive power supply voltage and a ground voltage, a common node between the first impedance and the second impedance being the output node, wherein the first gate drive circuit turns on the first transistor and turns off the second transistor to assert the first output signal to turn on the power switch and the first gate drive circuit turns off the first transistor and turns on the second transistor to deassert the first output signal to turn off the power switch; and wherein in response to the high voltage indicator signal being asserted, the first gate drive circuit turns off the first transistor and turns on the second transistor to deassert the first output signal to turn off the power switch.

6. The controller circuit of claim 1, wherein the first voltage is indicative of a voltage across the first and second power terminals of the power switch during the off-period of the power switch.

7. The controller circuit of claim 1, wherein the power switch comprises an insulated gate bipolar transistor (IGBT) device.

8. A method of generating a gate drive signal for driving a gate terminal of a power switch where the gate terminal controls the current flow between first and second power terminals of the power switch, the method comprising:
monitoring a feedback voltage indicative of a voltage across the first and second power terminals of the power switch;
providing a high voltage indicator signal;

determining the feedback voltage exceeding a first threshold level during the off-period of the power switch;
in response to the determining the feedback voltage exceeding the first threshold level, asserting the high voltage indicator signal;
determining the feedback voltage being below the first threshold level during the off-period of the power switch;
in response to the determining the feedback voltage being below the first threshold level, deasserting the high voltage indicator signal;
in response to the high voltage indicator signal being deasserted during the off-period of the power switch, providing a system input signal to drive the power switch to turn on and off, the system input signal determining an on-period and off-period of the power switch; and
in response to the high voltage indicator signal being asserted during the off-period of the power switch, blocking the system input signal from the power switch, the power switch being turned off regardless of the states of the system input signal.

9. The method of claim 8, wherein determining the feedback voltage exceeding the first threshold level comprises determining the feedback voltage exceeding a set voltage level; and determining the feedback voltage being below the first threshold level comprises determining the feedback voltage being below a reset voltage level, the set voltage level being higher than the reset voltage level.

10. The method of claim 9, further comprising:
subsequent to asserting the high voltage indicator signal, deasserting the high voltage indicator signal in response to the feedback voltage decreasing below the reset voltage level.

11. The method of claim 8, wherein monitoring a feedback voltage indicative of a voltage across the first and second power terminals of the power switch comprises monitoring a feedback voltage indicative of a voltage across the first and second power terminals of the power switch during the off-period of the power switch.

12. A controller circuit for generating a gate drive signal on an output node for driving a gate terminal of a power switch where the gate terminal controls the current flow between first and second power terminals of the power switch, the controller circuit comprising:
a first gate drive circuit configured to receive an input control signal and to generate a first output signal as the gate drive signal to drive the gate terminal of the power switch to turn on and off the power switch responsive to the input control signal, the first output signal having a first gate voltage value to drive the gate terminal of the power switch to turn on the power switch;
a first protection circuit configured to generate the input control signal in response to a system input signal and a feedback voltage indicative of a voltage across the first and second power terminals of the power switch, the system input signal determining an on-period and off-period of the power switch, while the power switch is in an off state in response to the system input signal and in response to the feedback voltage exceeding a first threshold level, the first protection circuit being configured to generate the input control signal to block the system input signal from being provided to the first gate drive circuit; and
a second protection circuit configured to receive the feedback voltage and to generate a fault detection indicator signal, the protection circuit asserting the fault detection indicator signal in response to the feedback voltage exceeding a second threshold level, the second threshold level being higher than the first threshold level, the second protection circuit being configured to generate a second output signal as the gate drive signal to turn on the power switch at a second gate voltage value for a predetermined time duration in response to the fault detection indicator signal being asserted while the power switch is in an off state in response to the system input signal.

13. The controller circuit of claim 12, wherein in response to the feedback voltage being below the first threshold level, the first protection circuit generates the input control signal mirroring the system input signal to drive the first gate drive circuit.

14. A method of generating a gate drive signal for driving a gate terminal of a power switch where the gate terminal controls the current flow between first and second power terminals of the power switch, the method comprising:
- monitoring a feedback voltage indicative of a voltage across the first and second power terminals of the power switch;
- determining the feedback voltage exceeding a first threshold level during the off-period of the power switch;
- in response to the determining, blocking a system input signal from the power switch, the system input signal determining an on-period and off-period of the power switch, the power switch being turned off regardless of the states of the system input signal;
- determining the feedback voltage exceeding a second threshold level higher than the first threshold level during the off-period of the power switch;
- in response to the determining, generating a clamped gate drive signal having a clamped gate drive voltage value and applying the clamped gate drive signal to turn on the power switch while the power switch is in an off state in response to the system input signal; and
- continuing to monitor the feedback voltage indicative of the voltage across the first and second power terminals of the power switch.

15. The method of claim 14, further comprising:
- determining the feedback voltage being below the first threshold level; and
- in response to the determining, providing a system input signal to drive the power switch to turn on and off.

* * * * *